United States Patent
Sakamoto et al.

(10) Patent No.: US 6,226,212 B1
(45) Date of Patent: May 1, 2001

(54) SEMICONDUCTOR MEMORY DEVICE, NONVOLATILE SEMICONDUCTOR MEMORY DEVICE, AND THEIR DATA READING METHOD

(75) Inventors: Yoshinori Sakamoto, Ome; Tatsuya Ishii, Kodaira; Atsushi Nozoe, Ome; Hitoshi Miwa, Ome; Kazuyoshi Oshima, Ome, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/050,885

(22) Filed: Mar. 31, 1998

(30) Foreign Application Priority Data

Mar. 31, 1997 (JP) .................................................. 9-080123

(51) Int. Cl.$^7$ ...................................................... G11C 7/02
(52) U.S. Cl. ..................... 365/207; 365/203.04; 365/206; 365/226
(58) Field of Search .............................. 365/207, 230.04, 365/206, 226

(56) References Cited

U.S. PATENT DOCUMENTS

| | | | |
|---|---|---|---|
| 4,967,396 | * 10/1990 | Kajigaya et al. | 365/207 |
| 5,363,330 | * 11/1994 | Kobayashi et al. | 365/185 |
| 5,587,946 | * 12/1996 | Campardo et al. | 365/185.02 |
| 5,654,916 | 8/1997 | Sato et al. | 365/185.06 |
| 5,828,600 | * 10/1998 | Kato et al. | 365/185.11 |

* cited by examiner

Primary Examiner—Vu A. Le
Assistant Examiner—Tuan T. Nguyen
(74) Attorney, Agent, or Firm—Antonelli, Terry, Stout & Kraus, LLP

(57) ABSTRACT

In order to eliminate erroneous reading of data by preventing noise which might otherwise be transmitted at the data reading time through parasitic capacitance in the data lines to other data lines, switches (Qt1 and Qt1') are interposed between a sense amplifier (SA) for amplifying the potential of a data line (DL) and the data line, and the sense amplifier is fed with an operating voltage after the potential of the data line is transmitted to the sense amplifier, and the switch is turned off.

83 Claims, 26 Drawing Sheets

FIG. 15

| | INITIAL STATE (ERASE STATE) | 1ST PROGRAM |
|---|---|---|
| CHANGE OF Vth DISTRIBUTION | "11" at 4.0V | "01" ← "11" at Vwv1=1.5V |
| BIAS CONDITION | 0V; b1(11)(01), b2(11)(00), b3(11)(10), b4(11)(11) | 5V; Vwg1=−11V; b1(01)(01), b2(11)(00), b3(11)(10), b4(11)(11) |
| PROGRAMMING DATA | 01  00  10  11 | 01  00  10  11 |
| DATA IN MEMORY CELL | 11  11  11  11 | 01  11  11  11 |
| DISTURB | −  −  −  − | 0  1  1  1 |

| | 2ND PROGRAM | 3RD PROGRAM |
|---|---|---|
| CHANGE OF Vth DISTRIBUTION | "01" "00" "11" at Vwv2=2.5V | "01" "00" "10" "11" at Vwv3=3.3V |
| BIAS CONDITION | Vwg2=−10.5V; 5V at b2; b1(01)(01), b2(00)(00), b3(11)(10), b4(11)(11) | Vwg3=−10V; 5V at b3; b1(01)(01), b2(00)(00), b3(10)(10), b4(11)(11) |
| PROGRAMMING DATA | 01  00  10  11 | 01  00  10  11 |
| DATA IN MEMORY CELL | 01  00  11  11 | 01  00  10  11 |
| DISTURB | 1  0  2  2 | 2  1  0  3 |

SEMICONDUCTOR MEMORY DEVICE, NONVOLATILE SEMICONDUCTOR MEMORY DEVICE, AND THEIR DATA READING METHOD

BACKGROUND OF THE INVENTION

The present invention relates to a technique which is especially effective when applied to a data reading system for a semiconductor memory device and, more particularly, to a technique which is effective when applied to a nonvolatile memory device (as will be simply referred to as the "flash memory") capable of erasing the data stored in a plurality of nonvolatile memory cells, electrically simultaneously.

In a highly integrated semiconductor memory, such as a dynamic random access memory (DRAM), one of the techniques, which has been adapted to prevent power noise caused at the start of operation of a sense amplifier, is one in which a current source for the sense amplifier is constructed to include a pair of MOSFETs connected in parallel and having different channel lengths. At the time of drive of the sense amplifier, one (i.e., the MOSFET having a smaller channel length) of the paired MOSFETs is turned on at first, and the other MOSFET (i.e., the MOSFET having a larger channel length) is then turned on. This effectively reduces the power fluctuation caused at the start of operation of the sense amplifier and reduces the noise due to power fluctuation, thereby to reduce erroneous reading of the DRAM. One of the publications disclosing the aforementioned techniques is Japanese Patent Laid-Open No. 62-275385 (275385/1983).

In the DRAM, the open bit line system having a low noise resistance has been adopted at first, but this system has been replaced by the folded bit line system, which has an excellent noise resistance. When noise occurs in the memory array of the DRAM of this folded bit line system, in-phase noise is transmitted to a pair of bit lines connected with one CMOS latch type differential sense amplifier through a parasitic capacitance between the bit lines. The differential sense amplifier is insensitive to the in-phase noise component on the paired bit lines so that the potential change of the bit lines in response to the data stored in a selected memory cell is accurately detected by the differential amplifier even if the in-phase noise component is carried on the paired bit lines.

A bit line shield system is a known technique for preventing erroneous reading of data due to noise in the semiconductor memory of the open bit line system. In the bit line shield system, in order to prevent erroneous reading of data due to the transmission of noise through the parasitic capacitance between adjoining data lines, the data lines are selected alternately every other line at the data reading time, and the unselected data lines are fixed at a ground potential or a reference potential. As a result, the unselected data lines, set to the ground potential or the reference potential, function as shielded lines to prevent erroneous reading of data.

In recent years, meanwhile, the simultaneous erase type electrically erasable and programmable nonvolatile read only memory (also referred to as the "flash EEPROM" or the "flash memory") is one of the nonvolatile memories which as been used as a memory medium for a portable personal computer, a portable telephone, a digital still camera or a flash memory card, and investigations and developments have been made for manufacturing a flash memory and for making a flash memory multivalue system.

In the flash memory, too, the open bit line system and the folded bit line system are employed. Examples of flash memories of the open bit system or the folded bit line system are disclosed in Japanese Patent Laid-Open Nos. 7-153286 (153286/1995), 7-57482 (57482/1995) corresponding to U.S. Pat. No. 5,446,690 and 9-35486 (35486/1997).

Meanwhile, a flash memory adopting the open bit line system and the bit line shielded system is disclosed in Japanese Patent Laid-Open No. 7-45087 (45087/1995) corresponding to U.S. Pat. No. 5,473,570.

SUMMARY OF THE INVENTION

We have investigated in detail the noise which occurs at the time of reading data in the simultaneous erase type nonvolatile memory device (flash memory) of the open bit line system and of the bit shielded reading system.

In a flash memory using, as memory cells, nonvolatile memory elements having control gates and floating gates, more specifically, the memory array, as shown in FIG. 24, includes: a plurality of memory cell columns MCC1 to MCCn having a plurality of nonvolatile memory elements MC1, MC2, . . . , and MCn; a plurality of local drain lines LDL1 to LDLn coupled to the drains of the memory cells of the memory cell columns MCC1 to MCCn; a plurality of main data lines DL1 to DLn provided correspondingly to the memory cell columns MC1 to MCn; a plurality of local source lines LSL1 to LSLn coupled to the drains of the memory cells of the memory cell columns MCC1 to MCCn; a plurality of select MOSFETs Qs1 for coupling the main data lines DL1 to DLn and the local drain lines LDL1 to LSLn respectively; and a plurality of select MOSFETs Qs2 for coupling the local source lines LSL1 to LSLn and a common source line CSL selectively. In the memory array thus constructed, we have conceived to make the common source line CSL of a metal layer so as to reduce the wiring resistance.

Since the common source line CSL intersects the data lines DL1 to DLn in this case, it may be formed of a first metal layer made of an aluminum layer or the like, whereas the data lines DL1 to DLn may be formed of a second metal layer. Since control signal lines SD1 and SS1 for feeding control signals for turning on/off the select MOSFETs Qs1 and Qs2 are arranged in the memory array, they are arrayed in a direction to intersect the data lines DL1 to DLn at right angles so that the control signal lines SD1 to SS1 are formed of a third metal layer.

FIG. 25 is a conceptual diagram relating to the section of the device thus constructed. In FIG. 25, reference symbol M1 designates the common source line CSL made of the first metal layer; symbol M2 designates the data lines DL1 to DL3 made of the second metal layer; and symbol M3 designates the control signal line SD1 (SST) made of the third metal layer. These metal layers M1, M2 and M3 are insulated by insulating films. Here, these insulating films are omitted from FIG. 25 so as to simplify the illustration. As a matter of fact, many other control signal lines are formed of the third metal layer over the memory mat including the memory cells, but are omitted to simplify the illustration.

We have found the following fact from the construction in which the common source line CSL of the first metal layer M1 and the control signal line SD1 (SST) of the third metal layer M3 are arranged over and under the data lines DL1 to DL3 of the second metal layer M2. Even if the reading system (the bit line shield system) is adopted in which the data lines (DL1 and DL3) are made to read data by selecting them while leaving the un-selected data lines (DL2, etc) at the ground potential or the like to function as the shielded lines, the change in the data line at the data "1" may be transmitted as noise to the data line of the data "0" through the parasitic capacitance C1 and C2, or C3 and C4 between the selected data lines (DL1 and DL3) and the first and third metal layers M1 and M3, thereby to cause erroneous reading.

FIG. 26 shows the behavior in which noise is transmitted. Specifically, the noise to the data line DL1, from which the data "0" is to be read out, is transmitted by the potential change of the data line DL3 to the data "1". In FIG. 26, the waveform a shows the potential change of the data line DL3, from which the data "1" is to be read out, and the waveform b shows the potential change of the data line DL1, from which the data "0" is to be read out. In the waveform a, the first step a1 is a change to the precharge level, and the second step a2 is a change to a Vcc level, caused by the amplifying action of a sense amplifier SA being driven. By this change of the data line DL3 to the Vcc level, a noise n1 is generated in waveform b of the data line DL1 through the path shown in FIG. 25. Here, when the data lines DL1, DL1', DL3 and DL3' are selected for the reading operation, the bit line shield system is adopted, as described hereinbefore, so that the data lines DL2, DL2', DL4 and DL4' are set to a fixed potential, such as the ground potential, although the invention is not especially limited thereto.

In the memory of the differential sense system, the selection side data lines (DL1 and DL3) are precharged to a potential of 1 V, for example, and the non-selection side data line DL1' and DL3' (the data lines on the opposite side, with the sense amplifier therebetween) are half-precharged to a potential of 0.5 V. As a result, the read data may be inverted from the stored data if the noise ni exceeds the potential (0.5 V) of the non-selection side data line DL1'. Here, the potential of the data line first rises and then drops in waveform b, because the selected memory cell is turned on by the select level of the word lines, so that the precharge potential of the data line is discharged by the selected memory cell.

Moreover, symbol c of FIG. 26 denotes the waveform of the non-selection side data line DL1'. IF the data "0" is read out on the selection side data line, it is amplified and changed to the Vcc level by the start of the sense amplifier. As a result, noise n2 is caused on the unselected data line DL3' for the same reason as the aforementioned one. Erroneous reading of the data may occur, that is, the data 0 may be read out in place of the data "1", even when the noise n2 becomes higher than the potential (the precharge level) of the selected data line DL3.

An object of the invention is to provide a semiconductor memory device in which erroneous reading is eliminated by preventing the occurrence of noise between data lines transmitted through parasitic capacitance in the data lines.

Another object of the invention is to provide a simultaneous erase type nonvolatile semiconductor memory device which can reduce erroneous reading of data.

Still another object of the invention is to provide a simultaneous erase type nonvolatile semiconductor memory device of an open bit line system and a bit line shield system, which can reduce erroneous reading of data.

Still another object of the invention is to provide a data reading method for a semiconductor memory device or a nonvolatile semiconductor memory device, which can reduce the occurrence of noise.

The aforementioned and other objects and novel features of the invention will become apparent from the following description to be made with reference to the accompanying drawings.

Representative aspects of the invention to be disclosed will be briefly described in the following.

In accordance with a first embodiment of the invention, more specifically, switch elements (Qt1 and Qt1'), interposed between a sense amplifier comprising a differential amplifier for amplifying the potential of a data line and the data line, transmit the potential of the data line to the sense amplifier and then change its active state from ON to OFF. After this, the sense amplifier is fed with its action voltage to start its amplifying action. In other words, the switch element is temporarily turned on so as to transmit the level of the data line to the sense amplifier.

As a result, the potential of the data line is not abruptly raised to a level, such as the power potential, by the amplifying action of the sense amplifier. The potential of the data line, selected for the reading action, keeps its potential, such as the precharge level, even when the threshold value of the selected memory cell is higher than the level of the selected word line. Specifically, the abrupt change itself of the data line potential acting as a noise source can be suppressed to eliminate the transmission of noise to another data line (i.e., the data line next to the adjoining data line) through the parasitic capacitance (C1 to C4) in the data lines, thereby to prevent erroneous reading of data.

In a second embodiment of the invention, the amplifying action of the sense amplifier is restricted by controlling the power voltage or the operating current to be fed to the sense amplifier. As a result, the potential changing rate of the data line is restricted to a low value. By this low rate of potential change, a high-frequency component, which is a noise component, is suppressed to prevent erroneous reading of data.

A first specific example in the second embodiment is made in the following manner. Specifically, the operating voltage of a sense amplifier power supply circuit, provided for feeding the power voltage selectively to the sense amplifier for amplifying the potential of the data line, is lowered. As a result, the operating voltage of the sense amplifier is lowered, delaying the potential change of the data line by the sense amplifier. As a result, the noise transmitted to another data line (the data line next to the adjoining one) through the parasitic capacitance (C1 to C4) in the data lines can be reduced to prevent erroneous reading of data.

A second specific example of the aforementioned second embodiment is made in the following manner. Specifically, a sense amplifier power supply circuit for feeding the power voltage to the sense amplifier for amplifying the potential of the data line is provided with a plurality of output transistors (Qv1 and Qv2). By controlling these output transistors so that they do not start simultaneously, but start with a time shift, the operating current of the sense amplifier is stepwise increased. When the output transistors are a pair of insulated gate field effect transistors, the gate width of one insulated gate field effect transistor is made larger than that of the other. Moreover, it is preferable that the insulated gate field effect transistor of wide gate width is turned on after the one of narrow gate width is turned on. Here in this embodiment, when the threshold value of the selected memory cell is higher than the potential of the selected word line, the potential of the selected data line at the selected memory mat changes from a precharge level as low as 1 V to the power voltage of 5 V, whereas the potential of the selected data line at the unselected memory mat changes from a precharge level as low as 0.5 V to the ground potential of 0 V. Since the potential change of the selected data line at the selected memory mat is larger than that of the selected data line at the unselected memory mat, it is preferable to provide a plurality of output transistors in a power supply circuit for feeding the power voltage Vcc selectively to the sense amplifier.

Moreover, the examples of the second embodiment can be individually combined with those of the first embodiment.

Here, the invention is especially effective when applied to a semiconductor memory device which is constructed such that, between a conductor layer forming the data lines and a conductor layer forming the word lines, there are arranged wiring lines of another conductor layer to intersect the data lines. Moreover, the invention is also especially effective when applied to a nonvolatile semiconductor memory device, such as a flash memory adopting the bit line shield system.

The invention is far more effective when applied to a multivalue flash memory for storing data of 2 bits in one memory cell, for example. In this multivalue flash memory, more specifically, the programming threshold values of the data are minutely controlled so that one of 2 bit data "00", "01", "10" and "11" may be stored in one memory cell. As a result, this multivalue flash memory has a narrow difference of the threshold values, set for storing the individual data, compared to that of the flash memory for storing data of 1 bit such as "0" or "1" in one memory cell, so that it is sensitive to the noise at the time of reading out the from the memory cells. To this multivalue flash memory, therefore, there may be applied the feature of the first embodiment, the second embodiment or a combination of the first and second embodiments.

BRIEF DESCRIPTION OF THE DRAWINGS

FIG. 15 is an explanatory diagram schematically showing one example of a method of programming the data of a multivalue flash memory according to the invention;

DESCRIPTION OF THE PREFERRED EMBODIMENTS

With reference to the accompanying drawings, first of all, an embodiment will be described, in which the invention is applied to a nonvolatile memory device (hereinafter referred to as the "flash EEPROM" or "flash memory") of the simultaneous erase type which is capable of electrically programming and erasing a semiconductor memory unit which is capable of storing two data values (one of "0" and "1" is stored in one memory cell) in one memory cell. This will be followed by a description of the case, in which the invention is applied to a flash memory capable of storing four values (one of "00", "01", "10" and "11" is stored in one memory cell), with reference to the accompanying drawings.

Figure 1:
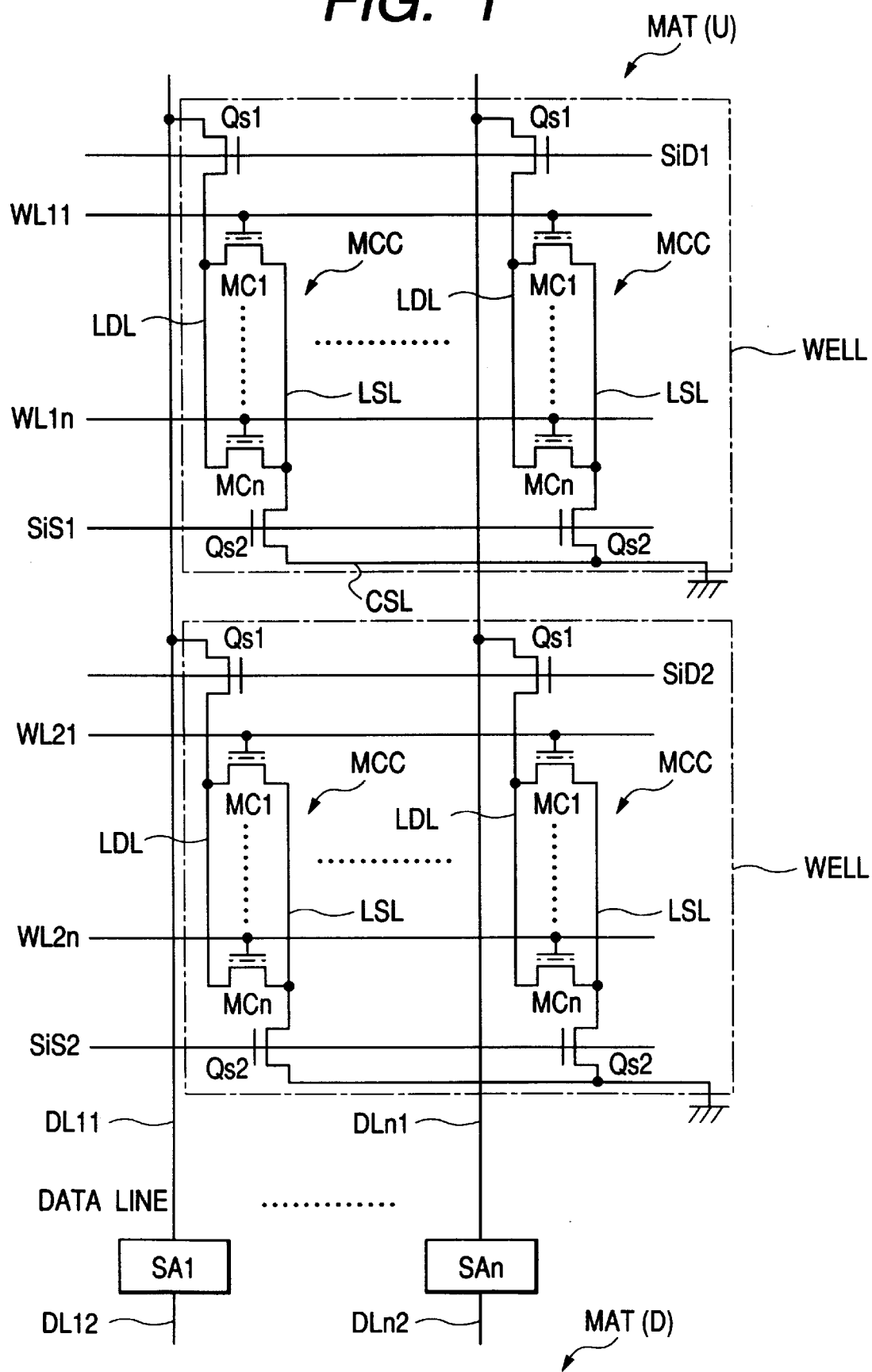
FIG. 1 is a circuit diagram showing one example of the construction of a memory array and a peripheral circuit of a flash memory, to which the invention is properly applied.
Figure 3:
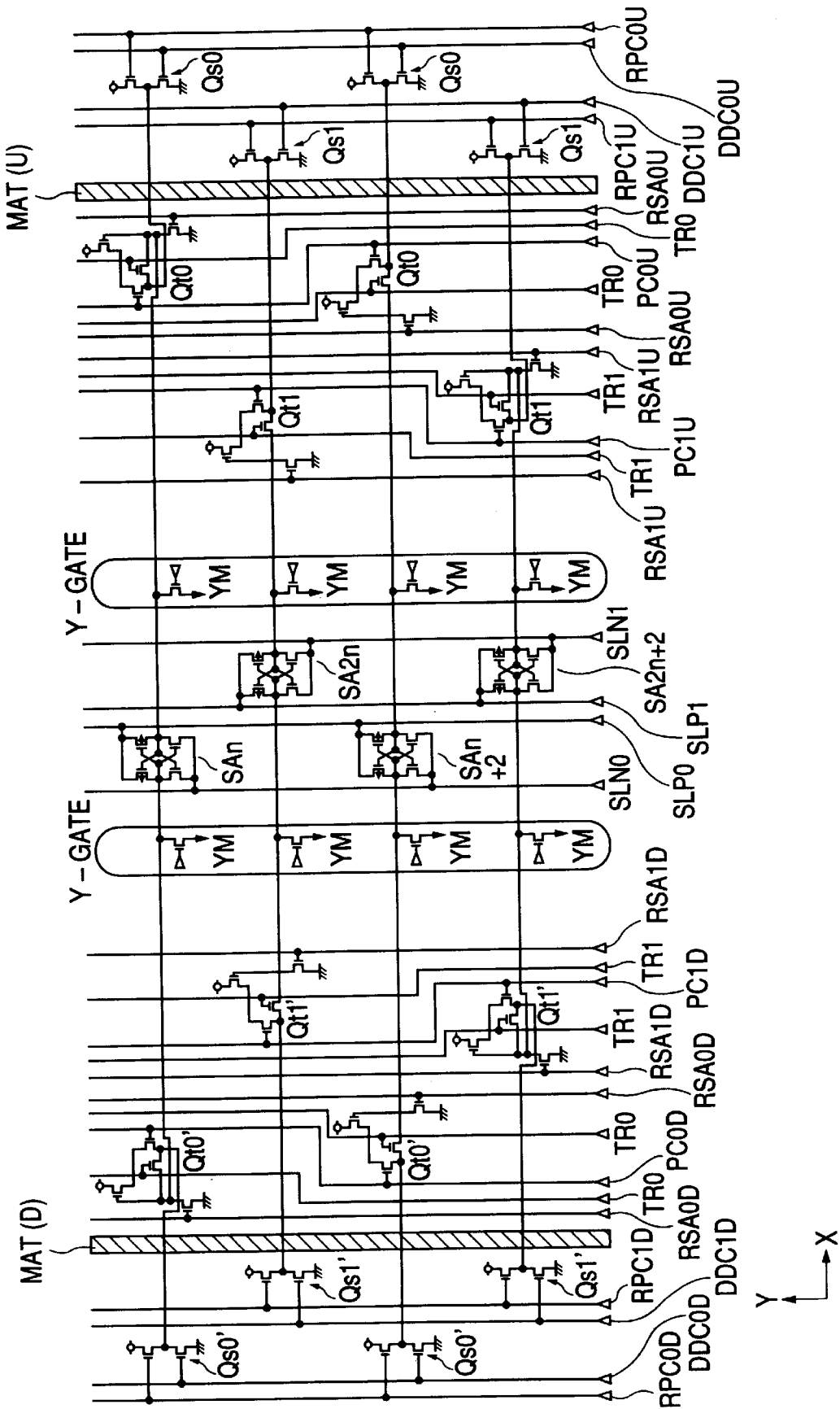
FIG. 3 is a specific circuit diagram of a flash memory of the bit line shield system.

FIG. 1 is a circuit diagram of a memory array of a flash memory. The memory array of this embodiment is constructed to include two mats (MAT(U) and MAT(D)), as shown in FIG. 3, one (MAT(U)) of which is specifically shown in FIG. 1.

In the memory mat MAT(U), as shown in FIG. 1, there are arranged individually in a row direction (the direction of word lines WL) and in a column direction (the direction of data lines DL) a plurality of memory columns MCC, each of which has n memory cells (MOSFETs having floating gates) MC1 to MCn arrayed in the column direction and connected in parallel with their individual sources and drains commonly connected. In each of the memory cell columns MCC, the drains and sources of the n memory cells MC1 to MCn are connected with a common local drain line LDL and a common local source line LSL, of which the local drain line LDL can be connected through a select switch MOSFET Qs1 to the corresponding data lines DL (DL11 to DLn1). The local source line LSL can also be connected through a select switch Qs2 to the ground point or a negative voltage. The control gates of the individual memory cells are connected to the corresponding word lines WL (WL11 to WL2n).

Those of the memory cell columns MCC, which are arranged in the word lines direction, are formed in a common P-type well region WELL over a semiconductor substrate, so that the data can be erased simultaneously by feeding a negative voltage such as −4 V to the well region WELL and a voltage such as 12 V to the word lines sharing the well region. Here, at the data erasing time, all the switch MOSFETs Qs1 and Qs2 sharing the well region WELL are turned on, so that the negative voltage of −4 V is applied to the sources and drains of the individual memory cells.

At the data programming time, a negative voltage of about −10 V is applied to the word line with which a memory cell to be selected is connected; a data line DL corresponding to the memory cell to be selected is set to a potential of about 4 V; and the select switch MOSFET Qs1 on the local drain line LDL, which is connected to the selected memory cell, is turned on to apply the voltage of about 4 V to the drain. At this time, however, the select switch MOSFET Qs2 on the local source line LSL is off. At the data reading time, a voltage of 3.3 V, for example, is fed to the word line which is connected to the memory cell to be selected; the data line DL corresponding to the memory cell to be selected is precharged to a potential such as 1 V; and the select switch MOSFET Qs1 on the local drain line LDL, connected to the selected memory cell, is turned on. At this time, moreover, the select switch MOSFET Qs2 on the local source line LSL is also turned on to apply the ground potential.

To the one ends (on the central side of the memory array) of the data lines DL11 to DLn1, there are individually connected sense amplifier circuits SA1 to SAn comprising differential amplifiers for detecting and amplifying the levels of the data lines at the reading time and for applying potentials corresponding to the programming data at the programming time. Since the memory array of this embodiment is constructed to include two mats, there is also arranged on the side opposed to the sense amplifier circuit SA, i.e., on the lower side of the drawing a similar memory mat MAT(D), the data lines DL12 and DLn2 which are connected to the other input/output terminals of the corresponding sense amplifier circuits SA1 to SAn.

Figure 2:
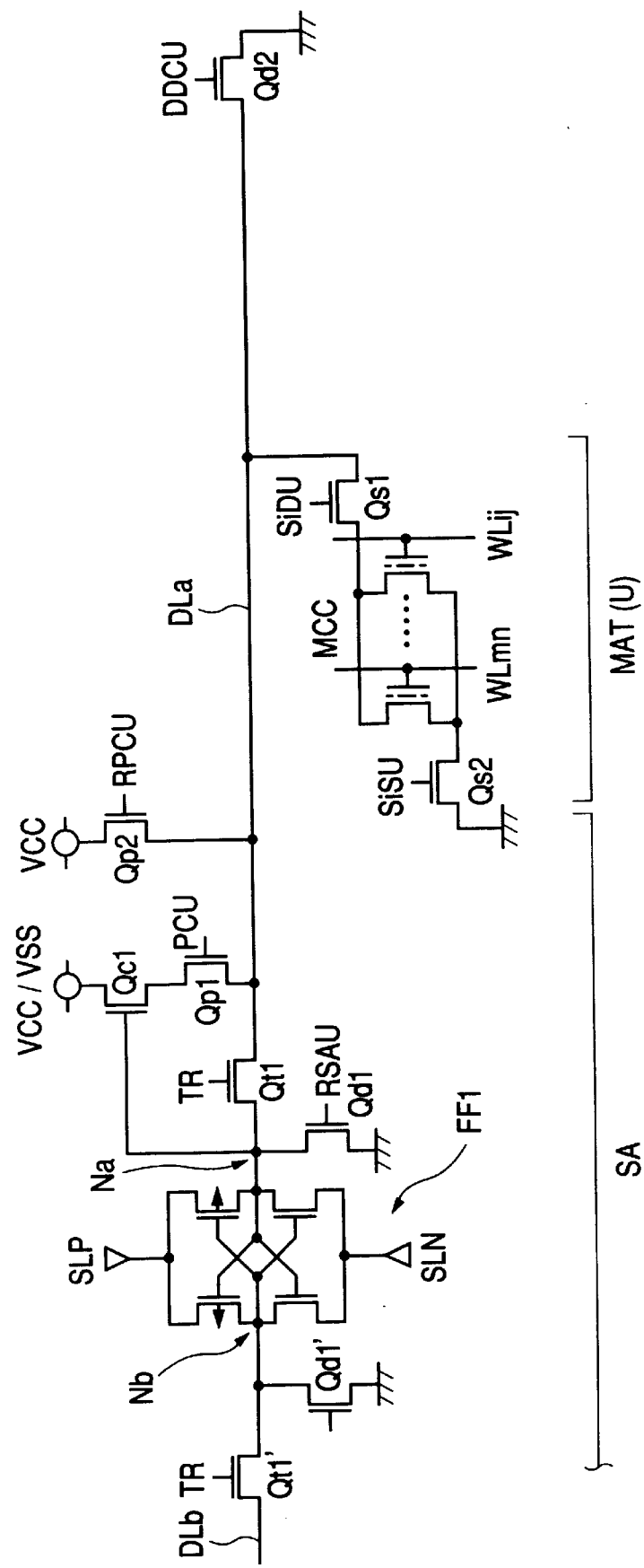
FIG. 2 is a circuit diagram showing a specific example of the memory array and a sense amplifier SA.

FIG. 2 shows a specific circuit example of a portion of the sense amplifier circuit SA and the memory mat MAT(U), as described above. Because of the symmetry with respect to the sense amplifier circuit, what is shown relates to one data line in the memory mat MAT(U). Although only one memory column MCC of those connected to the data lines is shown for convenience, there are connected in fact a plurality of memory columns MCC. As shown, the sense amplifier circuit SA is equipped with a flip-flop circuit FF1 in which the input/output terminals of two CMOS inverters having a P-channel MOSFET and an N-channel MOSFET are cross-connected. To one input/output terminal Na of the sense amplifier circuit SA, moreover, there is connected through a data transmission MOSFET Qt1 a data line DLa in one memory mat. To the other input/output terminal Nb of the sense amplifier circuit SA, there is connected through a data transmission MOSFET Qt1' a data line DLb in the other memory mat.

Moreover, discharging MOSFETs Qd1 and Qd1' are connected to the input/output terminals Na and Nb of the sense amplifier circuit SA, respectively, and a discharging MOSFET Qd2 is connected to the other terminal of the data line DLa. To each data line DL, there are connected precharging MOSFETs Qp1 and Qp2, of which the MOSFET Qp1 is connected through a MOSFET Qc1 to the terminal to which the power voltage Vcc or Vss is fed. Here, programming data can be inputted to the input/output terminals Na and Nb of the sense amplifier circuit SA through the not-shown common input/output line from a later-described data converting circuit.

FIG. 3 shows not only a circuit diagram of a more specific memory array portion but also a device layout image. This is for explaining the bit line shield system, the specific circuit construction of which is omitted on its detail circuit operation because it is equivalent to that of FIG. 2. Control signals are named by adding "0" and "1", and further "U" and "D".

When data is read out from the memory cells in the memory mat MAT(U), the control signals with "UU" are selectively activated at predetermined timings. When data is read out from the memory cells in the memory mat MAT(D), the control signals with "D" are selectively activated at predetermined timings.

When data is read out by using the sense amplifiers SAn and SAn+2 as a first sense amplifier group (odd sense amplifiers), the control signals with "D" are selectively activated at predetermined timings. When data is read out from a plurality of memory cells in the memory mat MAT (U), the control signals having "OU" are used. When data is read out from a plurality of memory cells in the memory mat MAT(D), the control signals having "OD" are used. Since data is read out by using the sense amplifiers SAn and SAn+2, control signals DDC1U and DDC1D are set to the high level. As a result, the data lines corresponding to sense amplifiers SA2n and SA2n+2 are set to the ground potential to fulfill the function as the bit line shield.

When data is read out by using the sense amplifiers SA2n and SA2n+2 as a second sense amplifier group (even sense amplifiers), the control signals with "1" are selectively activated at predetermined timings. When data is read out from a plurality of memory cells in the memory mat MAT (D), the control signals having "1U" are used. When data is read out from a plurality of memory cells in the memory mat MAT(D), the control signals having "1D" is used. Since data is read out by using the sense amplifiers SA2n and SA2n+2, control signals DDC0U and DDC0D are set to the high level. As a result, the individual data lines corresponding to sense amplifiers SAn and SAn+2 are set to the ground potential to fulfill the function as the bit line shield.

Figure 8:
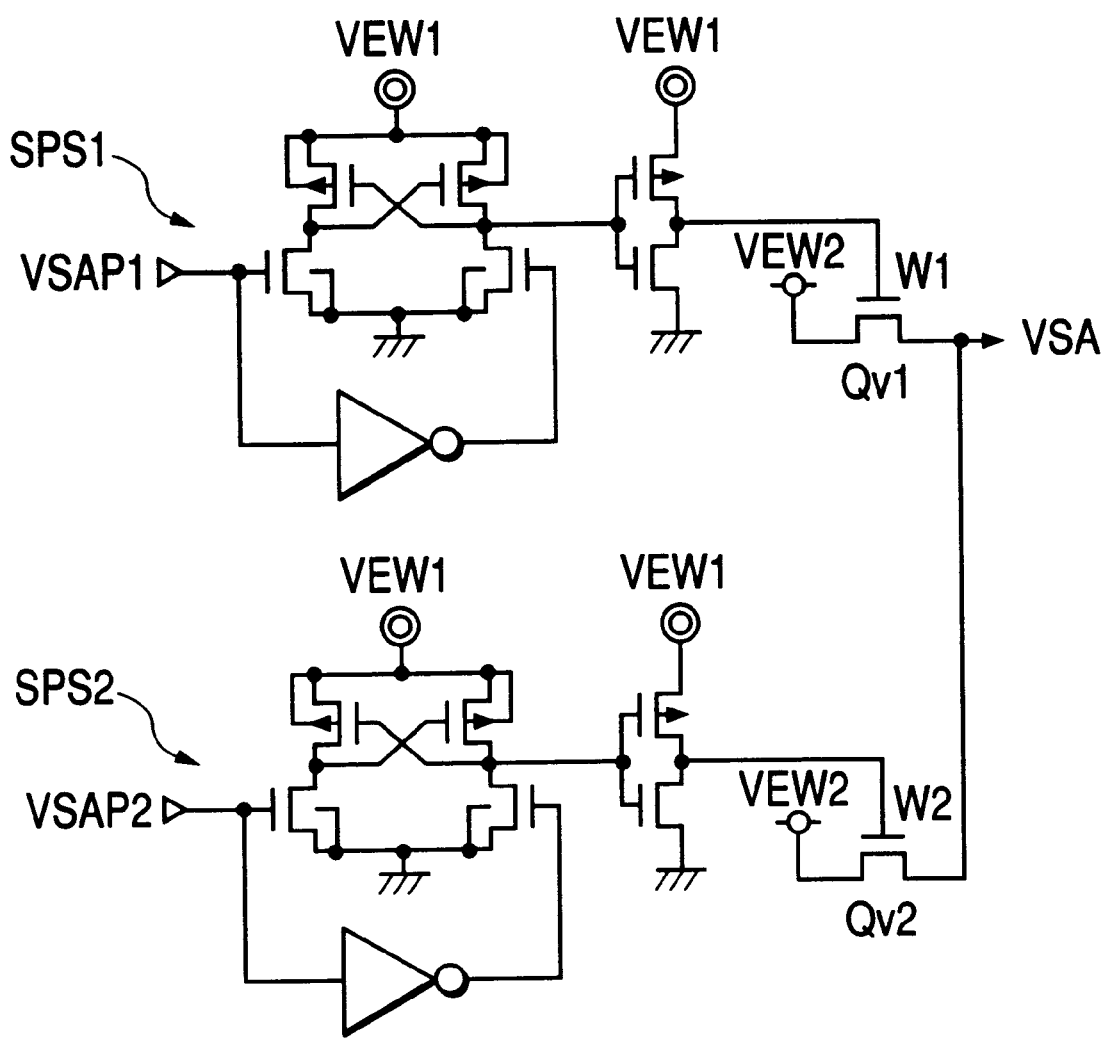
FIG. 8 is a circuit diagram showing a specific example of a sense amplifier power supply circuit of a third embodiment of the invention.

It is deemed that control signals SLN0 and SLP0 for activating the sense amplifiers SAn and SAn+2 are generated by a (not-shown) first sense amplifier power supply circuit having a circuit construction similar to that of the sense amplifier power supply circuit PSP shown in FIG. 5 or FIG. 8. It is also deemed that control signals SLN1 and SLP1 for activating the sense amplifiers SA2n and SA2n+2 are generated by a (not-shown) second sense amplifier power supply circuit having a circuit construction similar to that of the sense amplifier power supply circuit PSP shown in FIG. 5 or FIG. 8.

When the odd data lines of the first data line group are brought into a selected state, the control signals DDC0U/D for controlling the operation of transistors Qs0 and Qs0', which are short MOSFETs on the odd data lines, are changed from the high level, such as the power voltage Vcc, to the ground potential Vss (GND). The control signals DDC1U/D for controlling the operation of transistors Qs1 and Qs1', which are short MOSFETs on the even data lines, are kept at the high level, such as the power voltage Vcc. As a result, the even data lines are set to the ground potential Vss (GND) to function as shield lines. Thereafter, by a local drain line selecting signal SiDU shown in FIG. 1, the local drain line LDL of each memory cell column MCC is then coupled to the selected data line, so that the read data of the selected memory cell is read out to the selected data line. A control signal TR0 is selectively set to the high level, and transfer MOSFETs Qt0 and Qt0' are selectively turned on. Moreover, the operation of the sense amplifiers SAn and SAn+2 are controlled by the control signals SLN0 and SLP0, so that the data of the selected memory cell, coupled to the odd data lines, is read out to the sense amplifiers SA2n and SA2n+2.

After this, the control signals DDC0U/D are set to the high level to turn on the transistors Qs0 and Qs0' serving as the short MOSFETs on the odd data lines. Meanwhile, the control signal DC1U/D is set to the low level to turn off the transistors Qs1 and Qs1' serving as the short MOSFETs on the even data lines of the second data line group. As a result, the odd data lines are set to a potential such as the ground potential Vss (GND) to function as the shield lines. Thus, the data is read out by using the even data lines. By the local drain line selecting signal SiDU shown in FIG. 1, the local drain line LDL of each memory cell column MCC is coupled to the selected data line so that the read data of the selected memory cell is read out to the selected data line. A control signal TR1 is selectively set to the high level to turn on the transmission MOSFETS Qt1 and Qt1' selectively. When the control signal TR1 is selectively set to the high level, the control signals SLP1 and SLN1 of the second sense amplifier supply circuit are activated. The data of the selected memory cell is read out to the sense amplifiers SA2n and SA2n+2.

In FIG. 3, each Y-Gate includes a plurality of MOSFETs YM which receive at their gates the control signals sent from a not-shown Y-decoder, and the source-drain paths of which are coupled to the corresponding data lines and the corresponding not-shown common data line.

Here in FIG. 3, each data line is formed in the X-direction of the drawing of the second metallic wiring layer of aluminum or the like. Meanwhile, the control signal line for feeding each control signal comprises, in a Y-direction direction perpendicular to the X-direction, a third metallic wiring layer of aluminum or the like. In short, each data line is extended in a direction perpendicular to each control signal line, and it is therefore deemed that a parasitic capacitance is present between each data line and each control signal line. In other words, an abrupt change in the data line potential may be transmitted through the parasitic capacitance.

FIGS. 4A, 4B and 4C and FIG. 5 show examples of peripheral circuits which are disposed in the periphery of the memory array for feeding control signals to the various switch MOSFETs, precharge MOSFETs, discharge MOSFETs and transmission MOSFETs in the memory array, and operating voltages to the sense amplifier. In FIG. 4, symbol VR1/2 means that the selection side and the non-selection side are switched at the precharging power supply, for example, VR1=2 V at the selection side, and VR2=1.4 V at the nonselection side. In FIG. 5, symbols VEW1 and VEW2 denote boosted power supply voltages, e.g., VEW=12 V and VEW2=7 to 8 V.

Figure 4A:
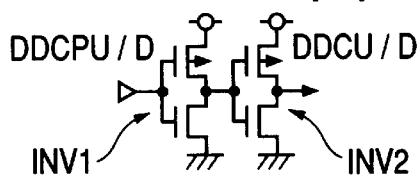
FIGS. 4(a) to 4(g) are circuit diagrams showing specific examples of a control signal generating circuit provided at the periphery of the memory array.
Figure 4C:
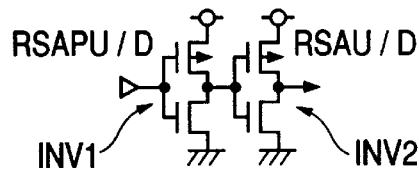
Figure 4B:
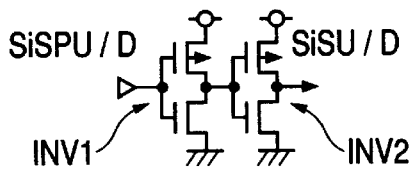
Figure 4D:
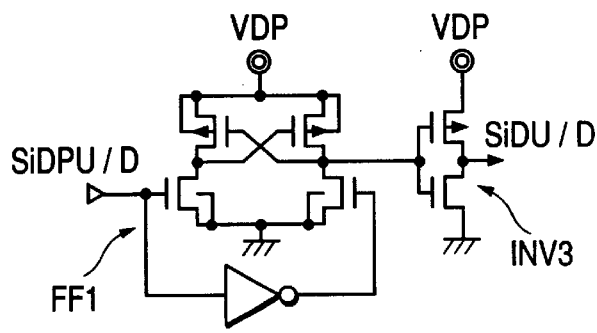
Figure 4E:
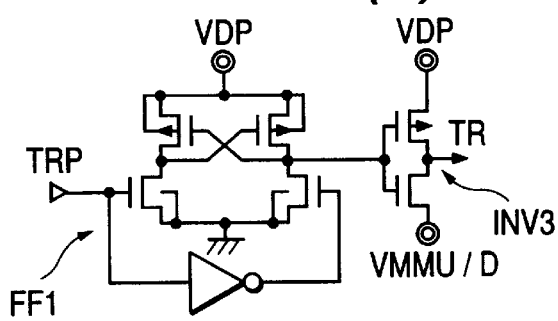
Figure 4F:
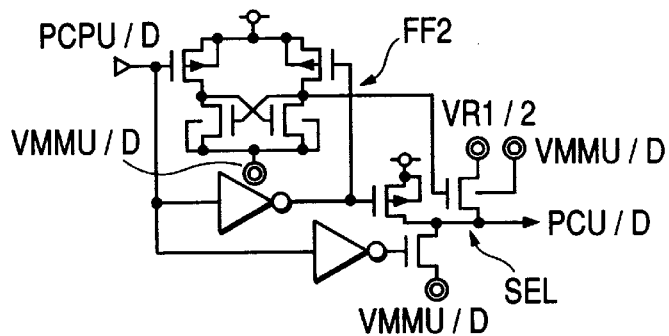
Figure 4G:
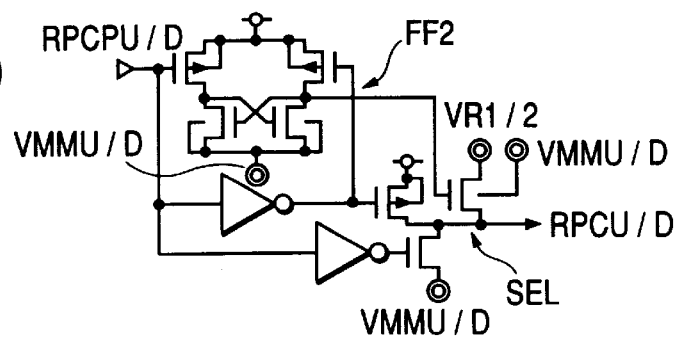

As shown in FIGS. 4A, 4B and 4C, circuits for generating control signals DDDCU/D (symbol "U/D" denotes both corresponding control signals in two memory mats), RSAU/D and SiSU/D are constructed to include two CMOS inverters INV1 and INV2 connected in cascade. Circuits for generating the control signals SiDU/D and TR are constructed to include a flip-flop circuit FF1 and a CMOS inverter INV3. In addition, circuits for generating the control signals CPU/D and RCPU/D are constructed to include a flip-flop circuit FF2 for latching an input signal, and a NAND circuit type selector SEL for selecting an output voltage in accordance with the input signal, as shown in FIGS. 4F and 4G.

Figure 5A:
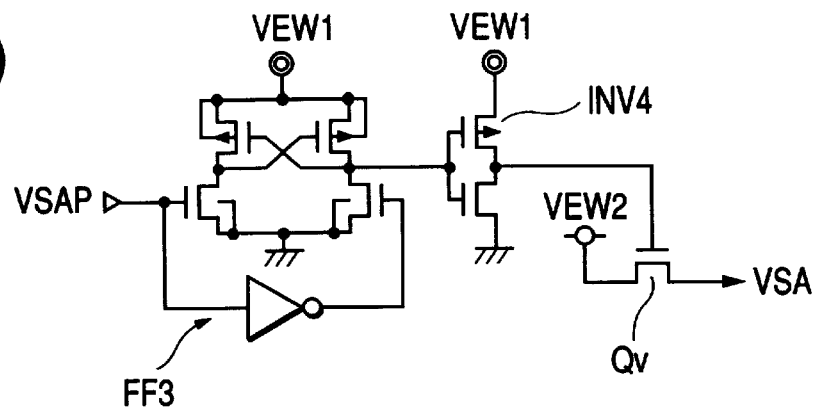
FIGS. 5(a) and 5(b) are circuit diagrams showing specific examples of a sense amplifier power supply circuit and power switching circuit, respectively, provided at the periphery of the memory array.
Figure 5B:
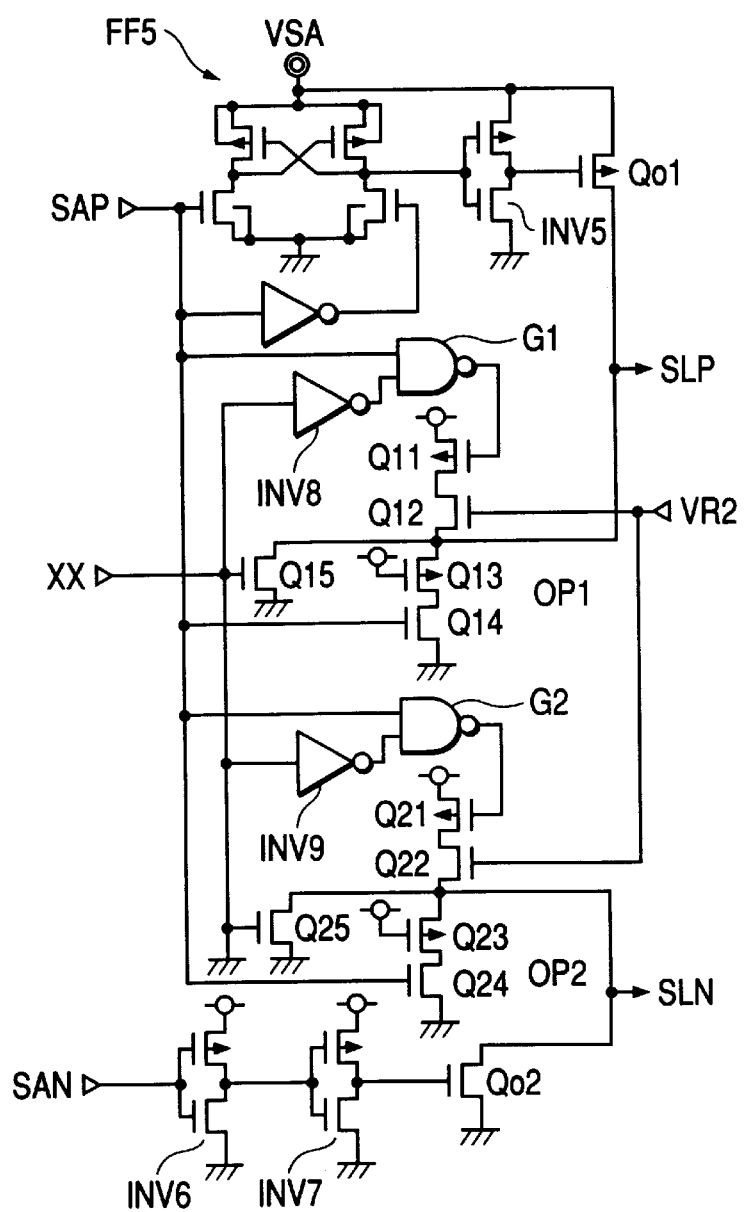

Meanwhile, a power supply circuit for feeding operating voltages SLP (SLP0 and SLP1) to the sense amplifier SA, as shown in FIG. 2 or FIG. 3, is constructed to include a power switching circuit, as shown in FIG. 5B, for receiving control signals SAP, SAN and VR2, and a power supply circuit connected to the power voltage terminal of the power switching circuit, as shown in FIG. 5A. The power supply circuit of FIG. 5A includes: a flip-flop circuit FF3 for receiving a control signal VSAP, a CMOS inverter INV4 for inverting the output of the flip-flop circuit FF3, and a MOSFET Qv controlled by the output of the inverter for transmitting the power voltage VEW2 as a voltage VSA.

The power switching circuit of FIG. 5B is constructed to include: a flip-flop circuit FF5 which receives the voltage VSA at its power voltage terminal and the control signal SAP as its input signal; a CMOS inverter INV5 for inverting the output of the flip-flop circuit FF5; an SLP outputting MOSFET Qo1 which is turned on/off by the inverter INV5; two-stage inverters INV6 and INV7 which receive the control signal SAN; an SLN outputting MOSFET Qo2 which is turned on/off by the inverter INV7; NAND gates G1 and G2 which receive control signals SAP and XX; an output-stage OPI having four series connected MOSFETS Q11 to Q14 and a MOSFET Q15 connected in parallel to the MOSFET Q13, which MOSFETs Q11 to Q15 receive as control signals the output of the NAND gate G1 and the control signals SAP and VR2, and output the SLP voltage when the sense amplifier is inactive; and an output-stage OP2 having four series connected MOSFETs Q21 to Q24 and a MOSFET Q25 connected in parallel to the MOSFET Q23, which MOSFETs Q21 to Q25 receive as control signals the output of the NAND gate G2 and the control signals SAP and VR2, and output the SLN voltage when the sense amplifier is inactive.

The power switching circuit of FIG. 5B has a complicated circuit structure because a circuit of a memory of another function is employed for facilitating the design. In this embodiment, however, the control signal XX is fixed at the ground potential. AS for the power switching circuit for this embodiment, therefore, the MOSFETS Q15 and Q25 and the inverters INV8 and INV9 of FIG. 5B can be omitted, and the NAND gates G1 and G2 can be replaced by inverters.

This power switching circuit feeds a voltage of 0.5 V to the sense amplifier SA when the input signals SAP and SAN are at the low level, and feeds the voltage VSA from the power supply circuit of FIG. 5A and the ground potential Vss as the signals SLP and SLN when the input signals SAP and SAN are at the high level, to start operation of the sense amplifier SA. While the sense amplifier SA iS inactive, the same voltage of 0.5 v is fed as the supply voltages SLP and SLN to the sense amplifier SA by setting the control signal VR2 to the high level. In response to this, the discharge MOSFET Qd1 in the memory array is turned on by a control signal RSAU to reset the potentials of the input/output terminals of the sense amplifier SA to the ground potential. By not feeding the ground potential, but feeding the voltage of 0.5 V, as the operating voltages SLP and SLN of the sense amplifier SA at the inactive time, neither the PMOS, nor the NMOS is turned on even when the input/output terminals of the sense amplifier are at 1 V or 0 V, so that erroneous amplification of the data line level can be prevented.

A voltage of 12 V is fed as the boosted voltage VEW1 in the circuit of FIG. 5A in the first embodiment as will be described in the following, and a voltage of 7 to 8 V is fed as the drain voltage VEW2. As a result, the power supplying MOSFET Qv is fed at its gate terminal with a voltage sufficiently higher than the drain voltage VEW2, and hence this voltage VEW2 can be fed as the supply voltage VSA to the circuit of FIG. 5B. As a result, a sufficiently high supply voltage SLP corresponding to the control signal SAP is fed to the sense amplifier SA, so that the sense amplifier SA acts at a high speed with a high amplification factor.

Figure 6:
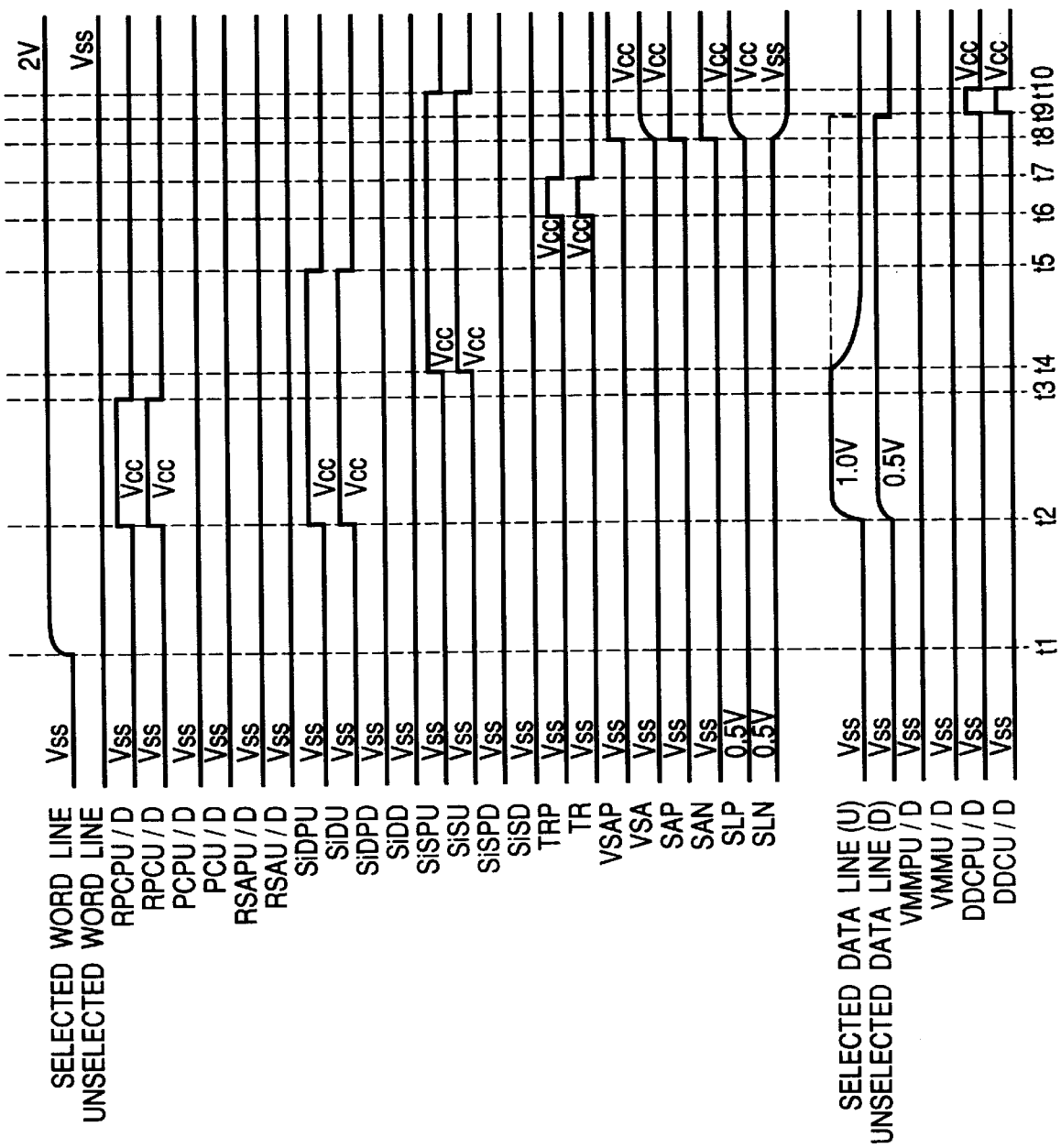
FIG. 6 is a timing chart illustrating a first embodiment of a method of reading the data of a flash memory according to the invention.

With reference to FIG. 6, the first embodiment of the memory cell reading system according to the invention will be described. In the first embodiment of the invention, the word line corresponding to the input address signal is raised to the selected level (at timing ti) to select the memory cell connected to the word line. After this, the select switch MOSFET Qs1 is turned on to connect the local drain line LDL to the data line DL, and the precharge MOSFET Qp2 is turned on to precharge the data line DL and the local drain line LDL (at timing t2 to t3). Then, the select switch MOSFET Qs2 is turned on to connect the local source LSL to the ground point to read out the level, corresponding to the stored data of the selected memory cell, onto the data line (at timing t4). The data transmission MOSFETS Qt1 and Qt1' are turned on to transmit the level of the data line DL to the input/output terminals Na and Nb of the sense amplifier SA (at timing t6). Then, the data transmission MOSFETS Qt1 and Qt1' are turned off (at timing t7), and the powers SLP and SLN are supplied to activate the sense amplifier SA (timing t8).

Thus, even if the sense amplifier SA is activated and the data is amplified, the transmission MOSFETs Qt1 and Qt1' are off, and consequently the data line DL keeps its original level. This can eliminate the noise which might otherwise be transmitted to other data lines through the parasitic capacitance existing between the data line DL and the common source line CSL (of FIG. 1) or the control signal lines (SiDU/D, SiSU/D, RPCU/D and TR), thereby to prevent erroneous reading of data. After the amplification of the level of the data line DL by the sense amplifier SA, the discharge MOSFET Qd2 on the data line DL is turned on by the control signal DDCU/D thereby to discharge the data line DL (at timing t9). It is more preferable that the unselected data lines are made to function as a shield by reading the data alternately from every other data line.

In the second embodiment, a voltage of 3.5 to 5 V is fed as the boosted voltage VEW1 in the power supply circuit of FIG. 5A, and a voltage of 7 to 8 V is fed as the drain voltage VEW2. Thus, the power supply MOSFET Qv is fed at its gate terminal with a voltage lower than the drain voltage VEW2, so that a voltage (<VEW2−VthQv) lower than VEW2 by a threshold voltage (VthQv) or more of the MOSFET Qv is fed as the power voltage VSA to the power switching circuit of FIG. 5B. As a result, when the power voltage SLP is fed to the sense amplifier SA in response to the control signal SAP, the current flowing through the sense amplifier SA is reduced to cause the sense amplifier SA to operate at a low speed with a lower amplification factor, unlike the first embodiment. This can reduce the noise, which might otherwise be transmitted to other data lines through the parasitic capacitance existing between the data line DL and the common source line CSL or the control signal lines (SiDU/D, SiSU/D, RPCU/D and TR), to prevent erroneous reading of data.

Figure 7:
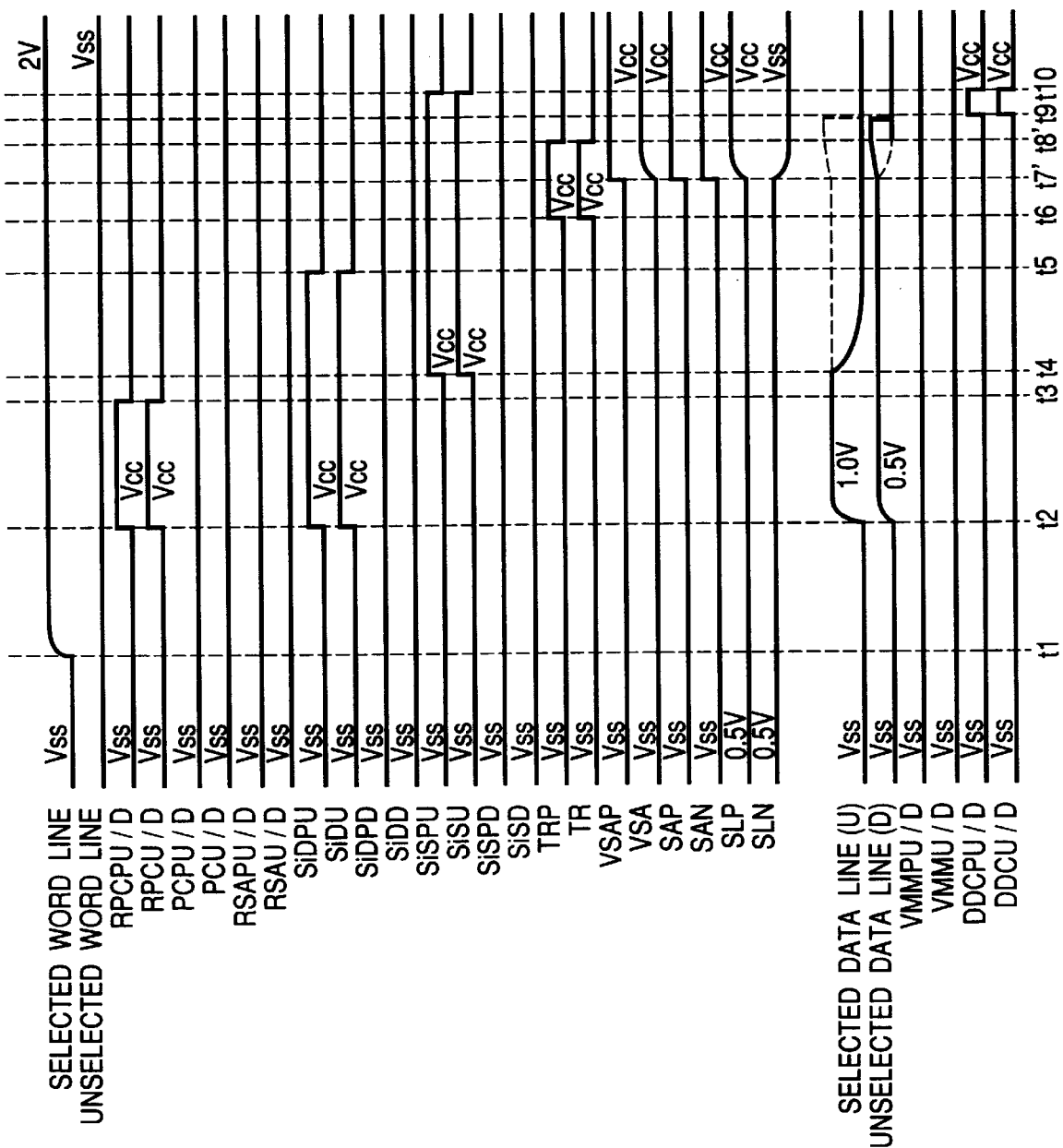
FIG. 7 is a timing chart illustrating a second embodiment of a method of reading the data of a flash memory according to the invention.

FIG. 7 illustrates the timings of the case to which the second embodiment is applied. What is different from the first embodiment shown in FIG. 6 is that the timing t7' for turning off the data transmission MOSFETs Qt1 and Qt1' to transmit the levels of the data lines to the sense amplifier is later than the activation timing t7' of the sense amplifier SA. In the case of this embodiment, the amplification of the sense amplifier SA itself is slower than that of the first embodiment, but the activation timing of the sense amplifier SA can be quicker than that of the first embodiment, thereby providing an advantage that the data reading time is substantially equal or slightly shorter as a whole.

FIG. 8 shows a circuit diagram of the power supply circuit relating to a third embodiment of the invention. In this third embodiment, two of the sense amplifier power supply circuits of FIG. 5A described in connection with the first embodiment are provided in parallel, as shown in FIG. 8. Their output terminals are coupled to each other, and the timings of the input control signals VSAP1 and VSAP2 are shifted from each other, so that the sense amplifiers SA are activated at two steps by activating the power supply circuit SPS1 at the upper stage and then the power supply circuit SPS2 at the lower stage.

Although the invention is not especially so limited, the gate width W1 of the MOSFET Qv1 acting as the output transistor of the power supply circuit SPS1 is made smaller than the gate width W2 of the MOSFET Qv2 acting as the output transistor of the power supply circuit SPS2. In short, W1<W2.

Thus, when the power voltage SLP is fed to the sense amplifier SA in response to the control signal SAP, the sense amplifier SA is first activated by a lower voltage than that of the first embodiment, thereby fixing the level on the data line. When the lower power supply circuit is then activated, the operating voltage of the sense amplifier SA is further raised to amplify the level of the data line to a higher level. As a result, the rise in the potential of the data line DL can be made gentler than that of the first embodiment, reducing the noise which might otherwise be transmitted to other data lines through the parasitic capacitance existing between the data line DL and the common source line CSL or the control signal lines (SiDU/D, SiSU/D, RPCU/D and TR), and thereby preventing erroneous reading of data.

Figure 9:
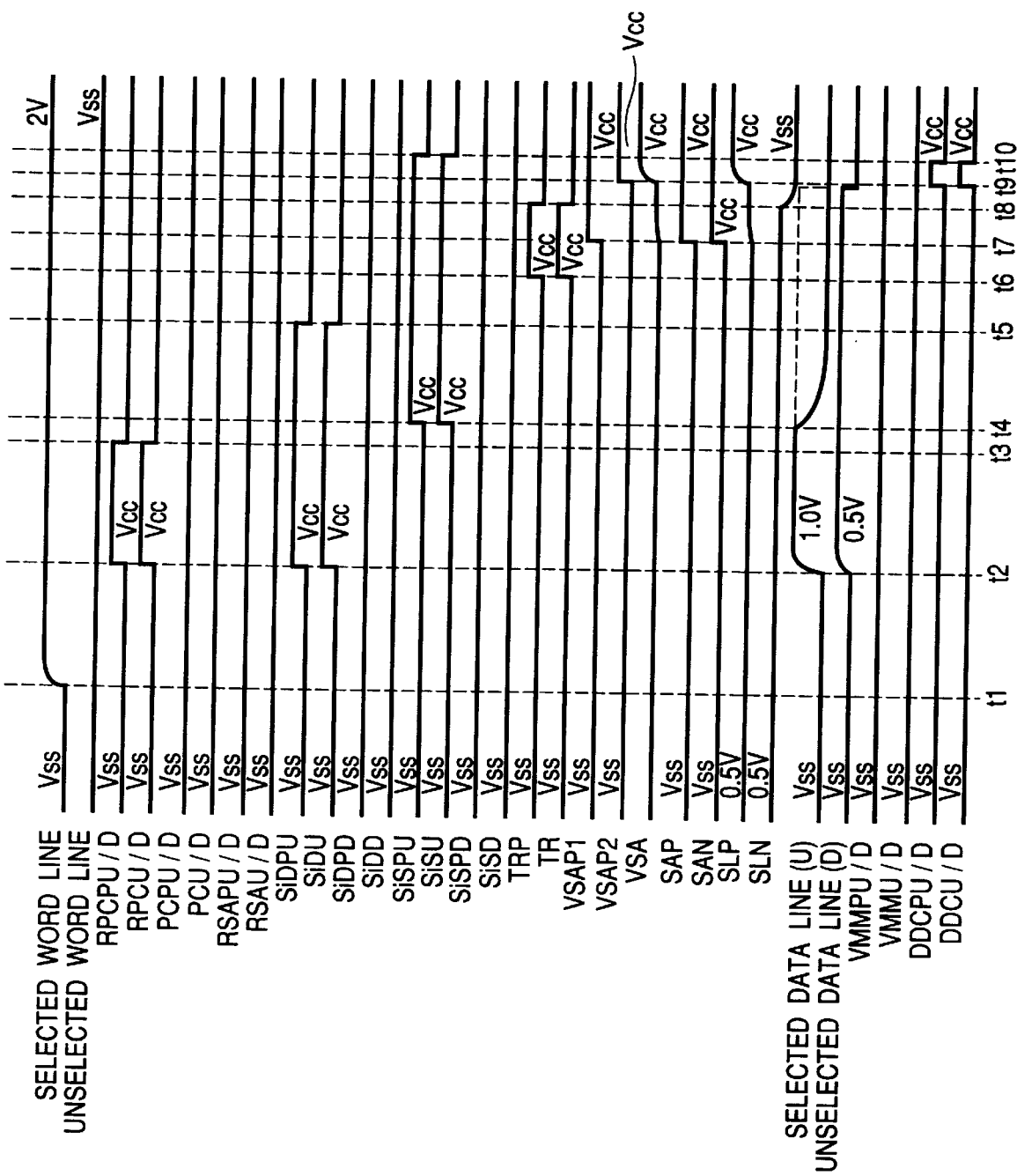
FIG. 9 is a timing chart illustrating data reading timings of the third embodiment of the invention.

FIG. 9 illustrates the timings of the case to which a third embodiment is applied. What is different from the first embodiment shown in FIG. 6 is that the control signals VSAP1 and VSAP2 are changed to the high level at shifted timings, and the supply current VSA increases at the timing t9 at which the control signal VSAP2 changes to the high level. Here in this third embodiment, the timing t8', at which the data transmission MOSFETS Qt1 and Qt1' for transmitting the levels of the data lines to the sense amplifiers are turned off, is later than the activation timing t7' of the sense amplifier SA at the first step. Moreover, the data transmission MOSFETs Qt1 and Qt1' are turned off before the timing t9 at which the sense amplifier SA is shifted to the operation of the second step.

Here, the timing t8', at which the data transmission MOSFETs Qt1 and Qt1' are turned off, may be later than the timing t9 at which the sense amplifier SA is shifted to the operation of the second step.

Figure 10:
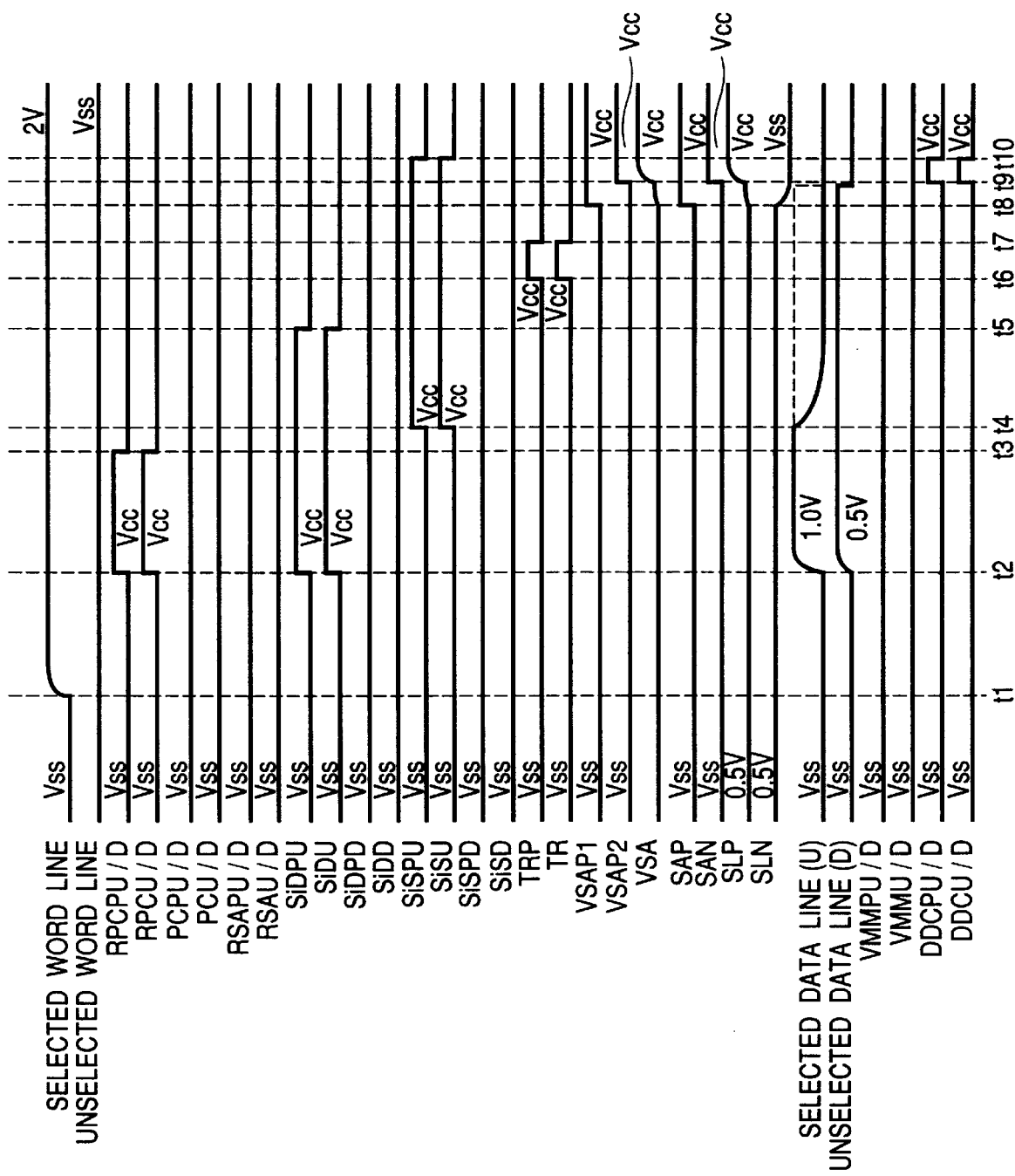
FIG. 10 is a timing chart illustrating a fourth embodiment of a method of reading out the data of a flash memory according to the invention.

FIG. 10 illustrates the timings of the case to which a fourth embodiment is applied. This fourth embodiment is a combination of the first embodiment and the third embodiment. Specifically, the data transmission MOSFETs Qt1 and Qt1' are turned on to transmit the level of the data line DL to the input/output terminals of the sense amplifier SA (at timing t6). After this, the data transmission MOSFETs Qt1 and Qt1' are turned off (at timing t7) before the voltages SLP and SLN are fed to activate the sense amplifier SA (at timing t8). At the same time, the two power supply circuits are provided in parallel, as shown in FIG. 8, to shift the timings of the input signals VSAP1 and VSAP2 so that the sense amplifier SA may act to amplify in two steps. As a result, the noise through the parasitic capacitance between the data lines is further reduced.

Figure 11:
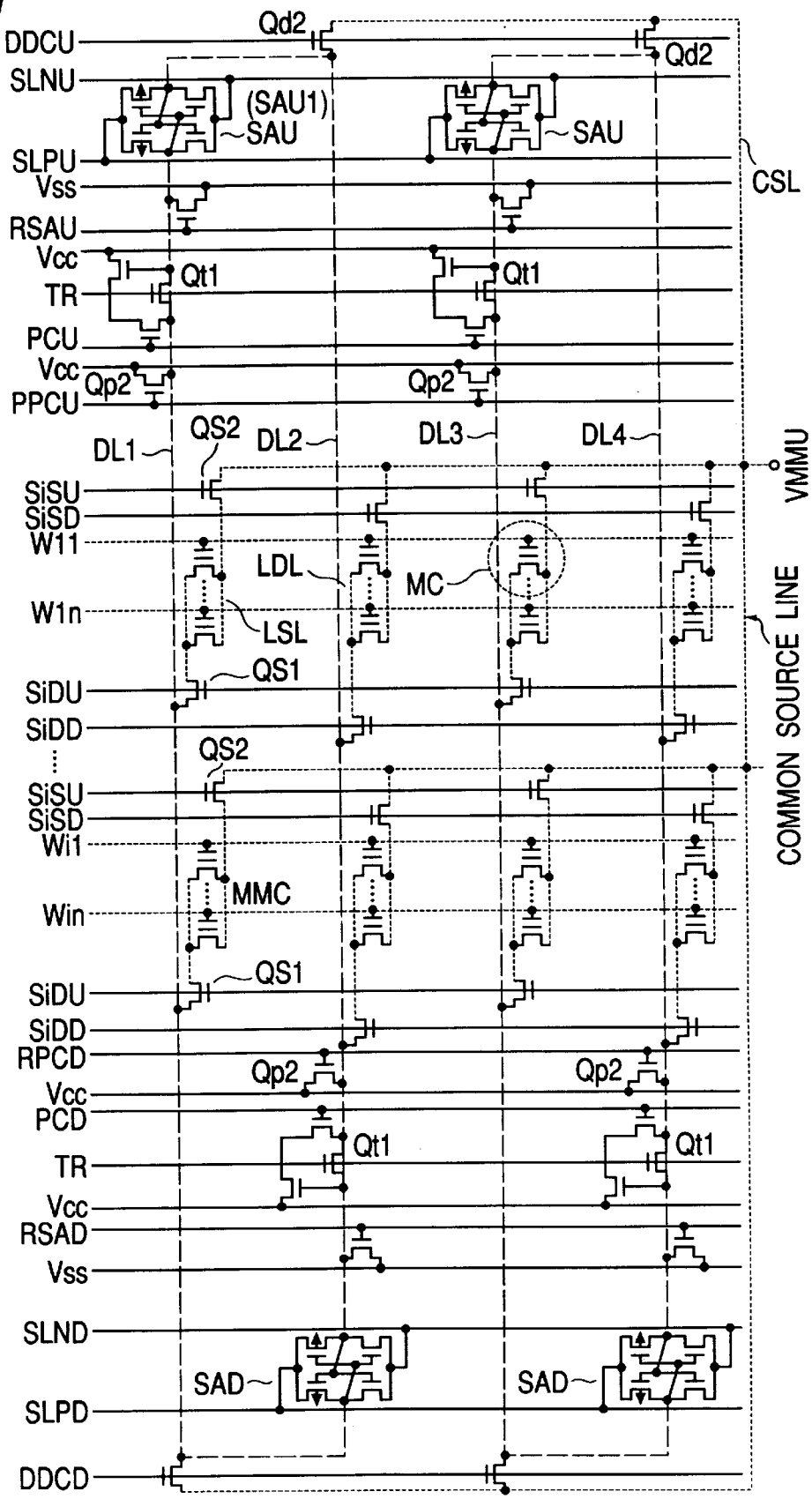
FIG. 11 is a circuit diagram showing an example of the construction of a memory array of a fifth embodiment of the invention.
Figure 12:
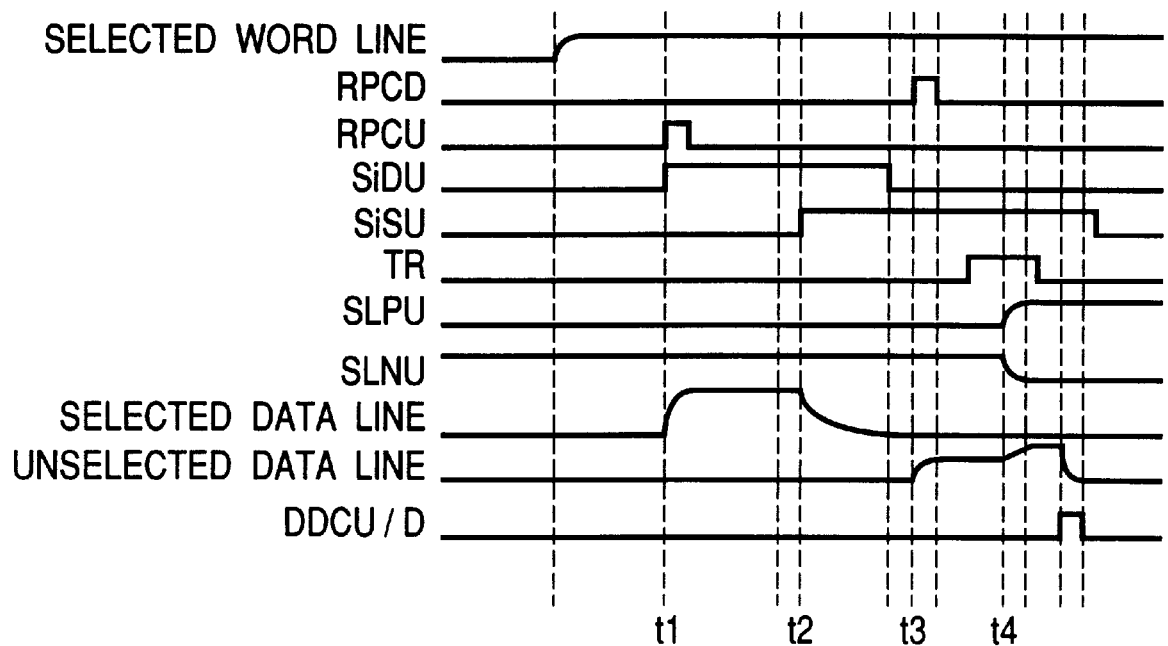
FIG. 12 is a timing chart illustrating data reading timings of the fifth embodiment of the invention.

FIGS. 11 and 12 show a fifth embodiment of the invention. This embodiment may have a memory array construction of the so-called "two-intersection system" (the folded bit line system), in which sense amplifiers SAU to SAD are alternately arranged outside of the memory array, and the input/output terminals of the individual sense amplifiers on the reference side are connected to the adjoining data lines. For data programming the so-called "one-intersection system" is used. Here, the control signals with "U" are activated at predetermined timings, when the data is read out by using the sense amplifier SAU, and the control signals with "D" are activated at predetermined timings when the data is read out by using the sense amplifier SAD.

In the memory array of this embodiment, too, the sense amplifiers are alternately activated for every other data line in the reading operation. Specifically, when the sense amplifier SAU on one side (on the upper side of FIG. 11) of the memory array is activated with sense amplifier activating signals SLNU and SLPU, the sense amplifier SAD on the other side (on the lower side) is inactivated with the ground potential of sense amplifier activating signals SLND and SLPD. Likewise, when the sense amplifier SAD is activated with the sense amplifier activating signals SLND and SLPD, the sense amplifier SAU is inactivated with the ground potential of the sense amplifier activating signals SLNu and SLPU. With such a construction and reading operation, even if noise is produced by a change of a data line on another data line, the noise is transmitted in phase on the reading side and the reference side of the sense amplifier, and consequently they can offset each other to read out data accurately.

This noise erasing action will be described with reference to the timing chart of FIG. 12. First, consider that the odd data lines (DL1 and DL3 in FIG. 11) in the memory array are selected. That is to say, consider that the data is read out by utilizing the sense amplifier SAU. In this case, after the rise of a word line (e.g., WL1), after the control signals SiDU and RPCU change to the high level, the select MOSFET Qs1 and the precharge MOSFET Qp2 are turned on, connecting the local data line LDL corresponding to data lines DL1 and DL3, and precharging the data lines DL1 and DL3 to about 1.0 V (at timing t1 of FIG. 12).

Next, the control signal SiSU changes to the high level to turn on the select MOSFET Qs2. As a result, the local source line LSL is connected to the ground point, and the stored data of the selected memory cell is read out to the data lines (at timing t2). Subsequently, the control signal RPCD changes to the high level, and the precharge MOSFET Qp2 on the even data line is turned on, half-precharging the data lines DL2 and DL4 to about 0.5 V.

After this, the transmission MOSFET Qt1 is turned on, and the level of.the selected data line is transmitted to the input/output terminals of the corresponding sense amplifier (the upper amplifier SAW). After this, the operating voltages SLPU and SLNU are fed to the sense amplifier SAU (at timing t4). Thus, the levels of the selected data lines DL1 and DL3 are amplified by the sense amplifier. For this amplifying action, assume that only the data line DL1 has the data "0", whereas the data line DL3 has the data "1". When the level of the data line DL3 is raised in this case by the amplifying action of the sense amplifier SA, the noise transmitted to the data line DL2 through the parasitic capacitance between the data lines and the control signals (SiSU, SiSD, SiDU, SiDP, PCU, PCD, RPCU, RPCD and TR) and the parasitic capacitance between the data lines and the common source line (CSL), are also transmitted through the data line DL2. Here in a sense amplifier (SAU1) for amplifying the level of the data line DL1, the memory array is constructed to perform amplification with reference to the level of the data line DL2, so that the noise from the data line DL3 can be in phase relative to the data lines DL1 and DL2, preventing erroneous reading of data.

Figure 13:
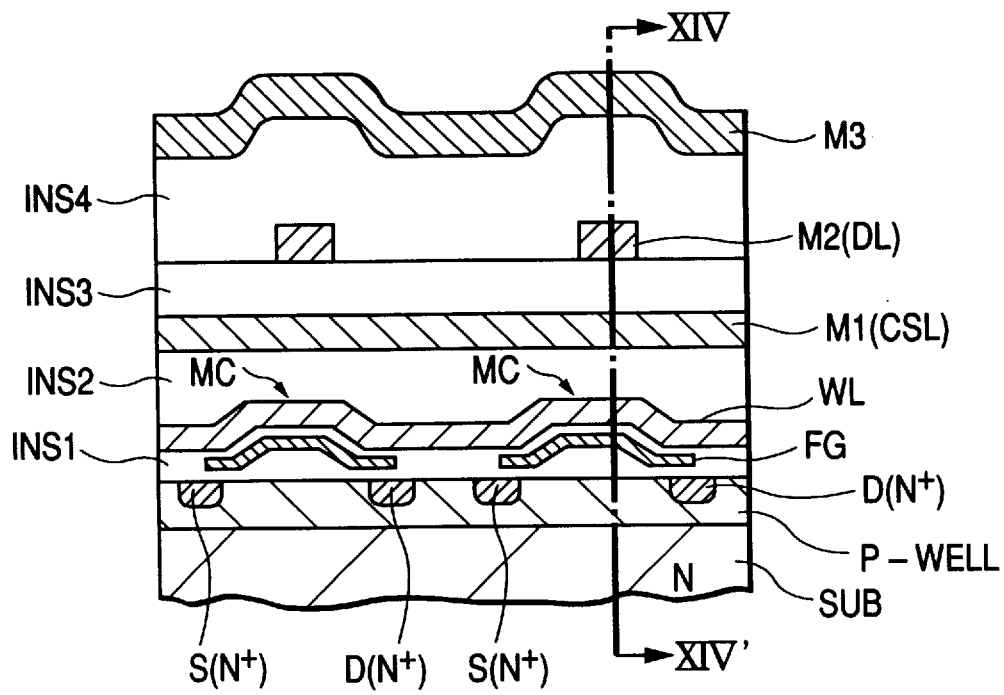
FIG. 13 is a section, taken in a direction perpendicular to data lines, of a memory cell unit in a flash memory according to the invention.
Figure 14:
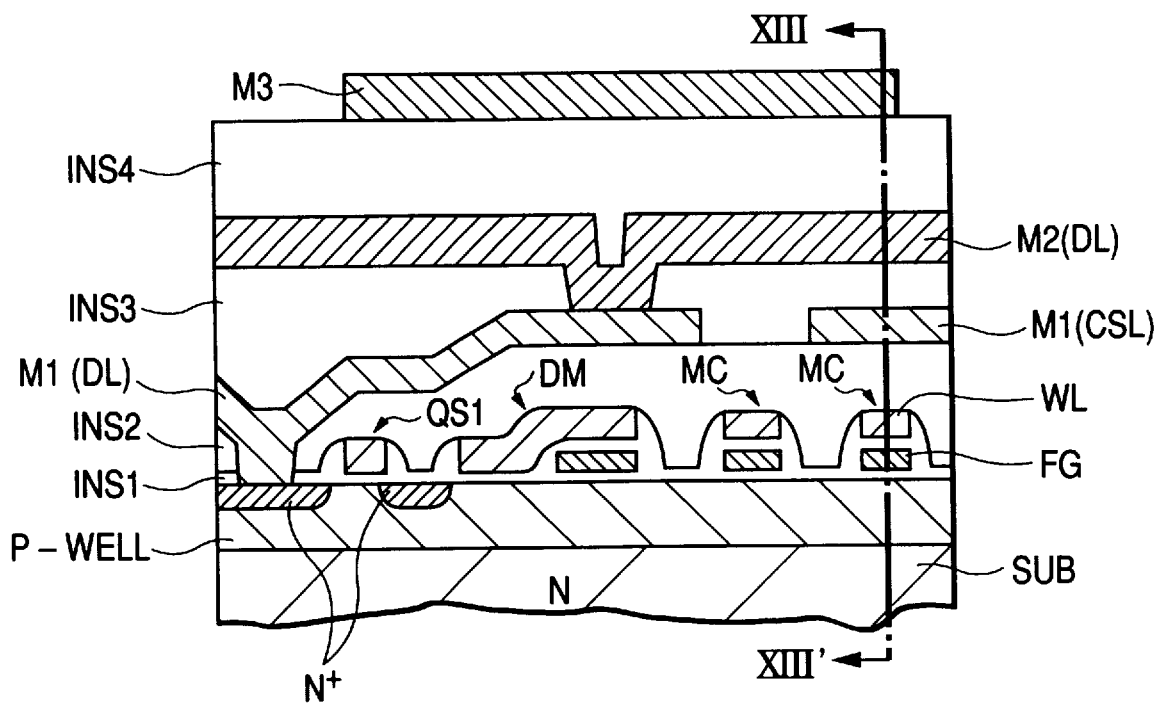
FIG. 14 is a section, taken along the data lines, of a memory cell unit in a flash memory according to the invention.

FIGS. 13 and 14 show one example of the sectional structure of the memory cell part in the memory array of the foregoing embodiments thus far described with reference to FIGS. 1 to 12. A section taken along line XIV-XIV' of FIG. 13 corresponds to FIG. 14, and a section taken along line XIII-XIII' of FIG. 14 corresponds to FIG. 13. In FIGS. 13 and 14, reference symbol SUB designates an N-type semiconductor substrate made of single crystalline silicon, and symbol FG designates a floating gate of a memory cell MC having MOSFETs and being made of conductive polysilicon formed over a P-type well region (P-well) formed in the substrate SUB through a relatively thin insulating film. Symbol WL designates a word line-cum-control gate of the MOSFET, which is a second layer of polysilicon. Symbol M1 designates a first metal layer formed mainly of an aluminum layer constituting the common source line CSL. Symbol M2 designates a second metal layer formed mainly of an aluminum layer constituting the data line DL. Symbol M3 designates a third metal layer formed mainly of an aluminum layer constituting a control signal line for feeding the control signals DDCU/D, RSAU/D, TR, PCU, RPC/D and SiSU/D and a power line for feeding the voltages SLP, SLN, Vss and Vcc. Symbols INS1 to INS4 designate insulating films for insulating the substrate SUB, the poly-silicon layer (WL) and the metal layers M1 to M3 from one another.

In FIG. 13, the source region (S) and the drain region (D) of the memory cell MC is an $N^+$-region and is formed to extend deeply from the plane of the drawing. The source region (S) of the memory cell MC constitutes the local drain line (LDL) of the memory cell column MCC, and the drain region (D) of the memory cell MC constitutes the local source line (LSL) of the memory cell column MCC, as shown in FIG. 1. As shown in FIG. 14, the data line DL formed of the second metal layer M2 is connected to the first metal layer M1 and is electrically connected to the N+-region acting as the drain region of the select MOSFET Qs1. The N+region acting as the source region of the select MOSFET Qs1 is coupled to the local drain line (LDL) of the corresponding memory cell column MCC. Here, the MOSFET DM shown in FIG. 14 is not used.

The common source line CSL is so disposed as to intersect the data lines DL at right angles, as seen from FIG. 1 showing the circuit construction of the memory array. In FIGS. 13 and 14, however, it is not clear in which direction the first metal layer M1 constituting the common source line CSL is extended. This is because the first metal layer M1 constituting the common source line CSL is formed in a sheet shape substantially all over the substrate in the memory array part so as to reduce its resistance. Moreover, the metal layers M1 to M3 are each shown as a single layer but may be formed into a multilayer structure comprising aluminum layers or other refractory metal layers. Likewise, the word line WL may also have a multilayer structure comprising polysilicon layers and metal layers of TiW or the like.

We will now describe a multivalue flash memory serving as a multivalue nonvolatile semiconductor memory device according to the invention. It is deemed that the individual control circuits of FIG. 4 and FIGS. 5A and 5B and the sense amplifier power supply circuit of FIG. 8 are applied to the multivalue flash memory. There is further utilized the bit line shield system, as shown in FIG. 3. As will be described with reference to FIG. 16, however, the data latch circuit DLT is added to each data line DL. ThUs, the circuit of the memory array part of the multivalue flash memory using the bit line shield system is given a circuit construction in which the data latch circuit DLT and additional circuit are disposed at the other end opposed to one end of each data line connected to the sense amplifier, as shown in FIG. 3. The sectional structure of the memory cell part is given a device structure as shown in FIGS. 13 and 14.

FIG. 15 shows a data programming procedure for the multivalue flash memory of this embodiment. In this embodiment, prior to programming, all the memory cells are set to the erase level (the threshold value is about 5 V and the stored data is "11"). Next, the memory cell (the stored data is "01") having the remotest threshold value (of about 1.4 V) from the erase level is programmed, as shown in FIG. 15. After this, the memory cell (the stored data is "00") having the next remotest threshold value (of about 2.4 V) from the erase level is programmed. Lastly, the memory cell (the stored data is "10") having the closest threshold value (of about 3.2 V) to the erase level is programmed. This procedure may be reversed, starting the programming from the memory cell (having the stored data "10") having the closest threshold value to the erase level.

The programming is performed from the memory cell which is the most unlikely to be subject to the influence of a word line disturbance, i.e., the memory cell which has the remotest threshold value from the erase level. Two word line disturbances of the memory cell (the stored data is "01") having the remotest threshold value (about 1.4 V) from the erase level occur. However, the word line disturbance of the memory cell which is the most likely to be subject to the influence of a word line disturbance, i.e., the memory cell (the stored data is "10") having the closest threshold value (about 1.4 V) to the erase level can be reduced to zero. As compared with the method of starting the programming from the side close to the erase level, therefore, a fluctuation in the threshold value produced by a word line disturbance can be suppressed to a low value.

Figure 16:
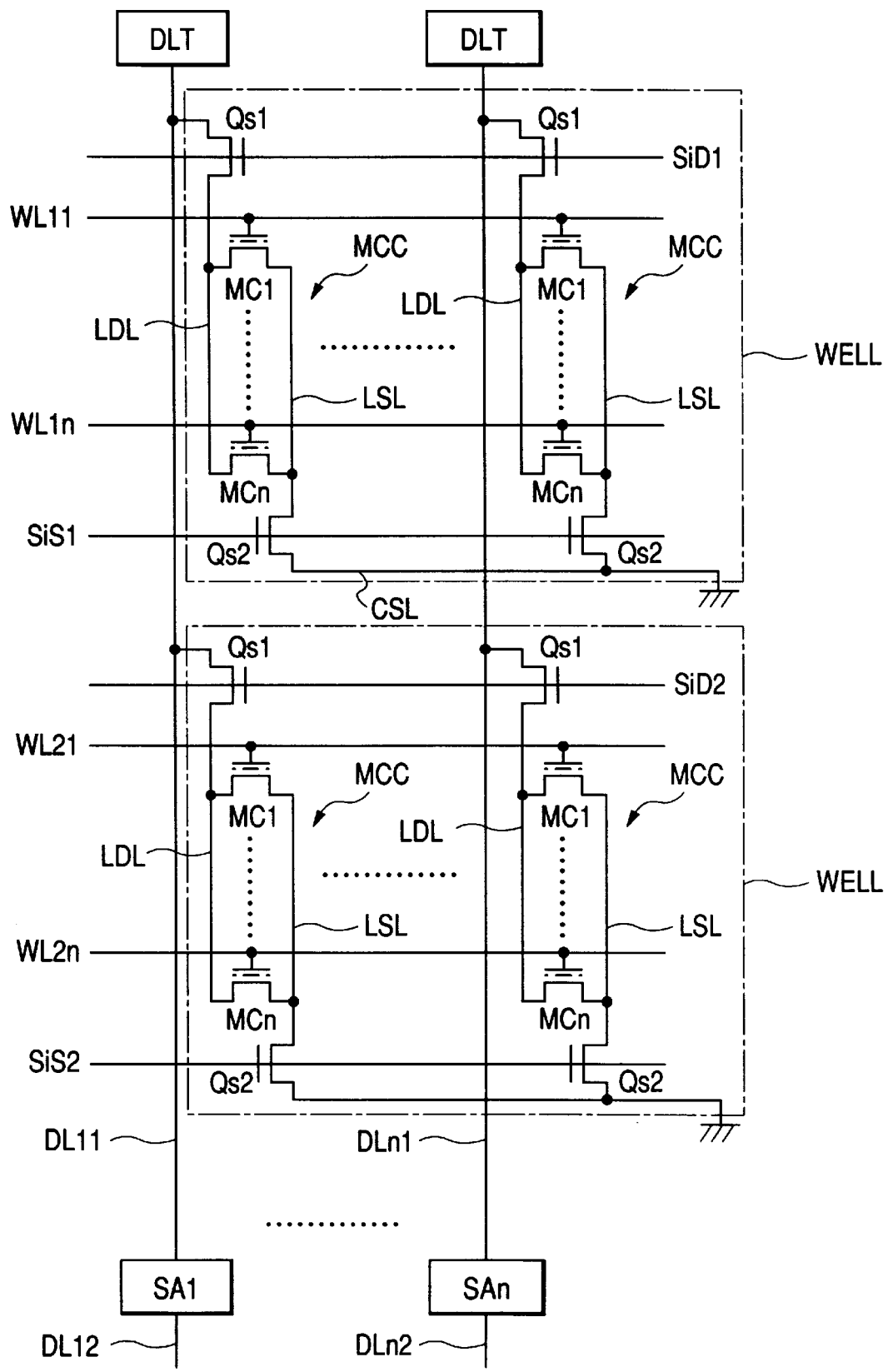
FIG. 16 is a circuit diagram showing one example of a memory array and a peripheral circuit of a multivalue flash memory according to the invention.
Figure 22:
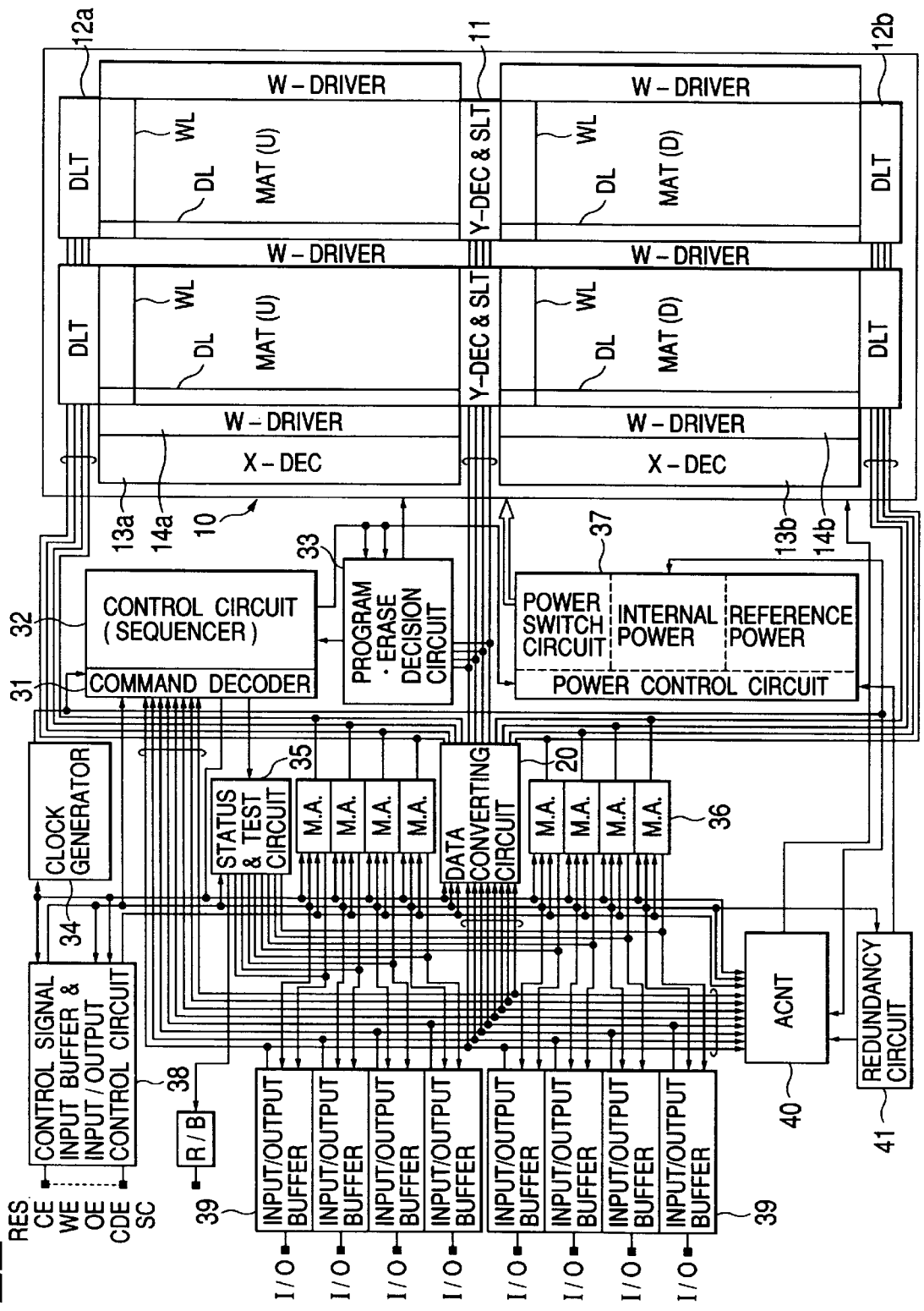
FIG. 22 is a block diagram schematically showing one example of the multivalue flash memory, to which the invention is preferably applied.

FIG. 16 shows a specific example of a memory array 10 as shown in FIG. 22. The memory array 10 of this embodiment is constructed to include two mats (MAT(U) and MAT(D)), one (upper) memory mat MAT(U) of which is partially shown in FIG. 16.

In the memory mat MAT(U), as shown in FIG. 16, there are arranged individually in a row direction (the direction of word lines WL) and in a column direction (the direction of data lines DL) a plurality of memory columns MCC each of which has n memory cells (MOSFETS having floating gates) MC1 to MCn arrayed in the column direction and connected in parallel to their sources and drains, which are commonly connected. In each of the memory cell columns MCC, the drains and sources of the n memory cells MC1 to MCn are connected to a common local drain line LDL and a common local source line LSL, of which the local drain line LDL can be connected through a select switch MOSFET Qs1 to the corresponding data lines DL (DL11 to DLn1). The local source line LSL can also be connected through a select switch Qs2 to the ground point or a negative voltage.

Memory cells of the memory cell columns MCC, which are arranged in the word lines direction, are formed in a common P-type well region WELL over a semiconductor substrate. At the simultaneous erasing time, all the data can be erased simultaneously by feeding a negative voltage such as −4 V to the well region WELL and a voltage such as 12 V to the word lines sharing the well region. Here, at the data erasing time, all the switch MOSFETs Qs1 and Qs2 sharing the well region are turned on, so that a negative voltage such as −4 V is applied to the sources and drains of the individual memory cells.

At the data programming time, meanwhile, a negative voltage of about −10 V is applied to the word line to which a memory cell to be selected is connected, although the invention is not especially limited thereto. Moreover, a data line-De (DL11 to DLn1) corresponding to the memory cell to be selected is set to a potential such as about ±4 V, although the invention is not especially limited thereto; and the select switch MOSFET Qs1 on the local drain line LDL, which is connected to the selected memory cell, is turned on, and a voltage of about 4 V is applied to the drain of the selected memory cell. At this time, however, the select switch MOSFET Qs2 on the local source line LSL is off.

At the data reading time, voltages of 1.5 V, 2.5 V and 3.3 V, although the invention is not especially limited thereto, are sequentially fed to the word line which is connected to the memory cell to be selected; the data line DL (DL11 to DLn1) corresponding to the memory cell to be selected is precharged to a potential such as 1 V; and the select switch MOSFET Qs1 on the local drain line LDL connected to the selected memory cell is turned on. At this time, moreover, the select switch MOSFET Qs2 on the local source line LSL is also turned on to apply the ground potential.

To the one ends (on the central side of the memory array) of the data lines DL (DL11 to DLn1), there are respectively connected sense amplifier circuits SA (SAT to SAn) comprising differential amplifiers for detecting and amplifying the levels of the data lines at the reading time and for applying potentials corresponding to the programming data to the data lines DL (DL11 to DLn1) at the programming time. To the other ends of the data lines DL (DL11 to DLn1), there are connected a data latch circuit DLT which can latch the programmed data and the read data. The data latch circuit DLT is given a circuit construction similar to that of the sense amplifier SA, although the invention is not especially limited thereto. In short, the data latch circuit DLT comprises a CMOS latch circuit. Since the memory array MAT (U) of this embodiment is constructed to include two mats, a similar memory mat is also arranged on the opposed side to the sense amplifier circuits SA1 to SAn, i.e., on the lower side of the drawing, and the data lines DL (DL12 and DLn2) are respectively connected to the other input/output terminals of the corresponding sense amplifier circuits SA (SAT to SAn). The other end of each data line DL (DL12 to DLn2) is equipped like before with a data latch circuit DLT.

The data latch circuit DLT connected to each of the data lines DL (DL11 to DLn1 and DL12 to DLn2) need not be provided but may be disposed outside the memory array so that the data may be transferred to/from the sense amplifiers SA (SAT to SAn) at the programming time or at the reading time.

Figure 18:
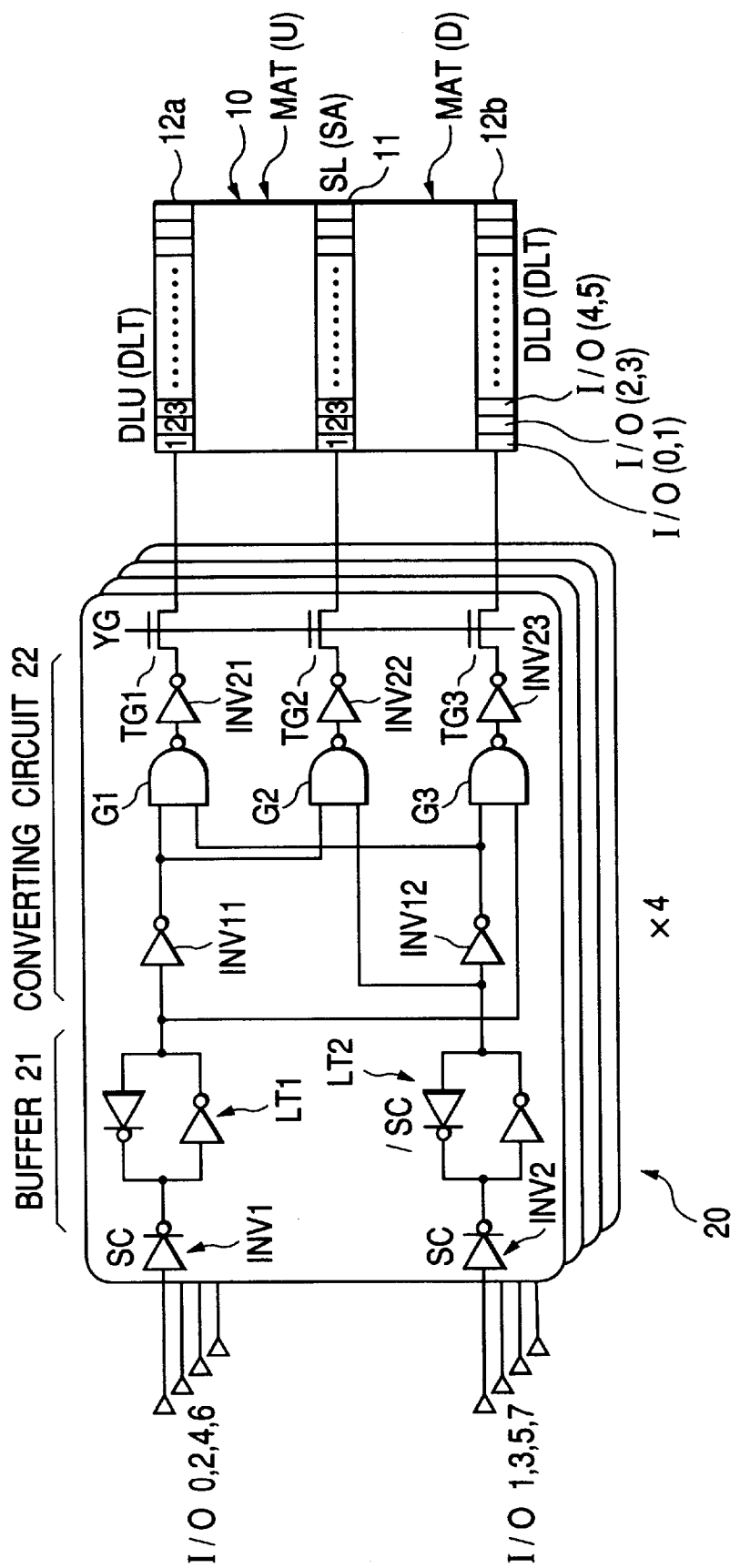
FIG. 18 is a logic circuit diagram showing one example of a data converting circuit in a multivalue flash memory, to which the invention is preferably applied, for converting programming data of 2 bits into quaternary data.

FIG. 18 shows the relations among a data converting circuit for conversion from data inputted of the outside and stored to multivalue data stored in the memory cells, a sense amplifier column (SL) 11 in the data converting circuit 20 in the memory array 10, and data latch columns (DLU (DLT) and DLD (DLT)). The data converting circuit 20 has an input buffer 21 and a data converting circuit 22 and can receive data of 8 bits in pairs of 2 bits in parallel. FIG. 18 shows the detail of the input buffer and the data converting circuit of one set. The data converting circuit of one set will be described.

The input buffer 21 of the data converting circuit of one set is constructed to include two clocked inverters INV1 and INV2 and latch circuits LT1 and LT2. The data converting circuit 22 is constructed to include: inverters INV11 and INV12 connected to the latch circuits LT1 and LT2 of each set; three NAND gate circuits G1, G2 and G3 for receiving the outputs of the two inverters INV11 and INV12 and the outputs of the latch circuits LT1 and LT2 of each set as its input signals; inverters INV21, INV22 and INV23 for inverting the outputs of those gate circuits; and transmission gates TG1, TG2 and TG3 having MOSFETs connected to those inverters. One data converter of the data converting circuit 20 converts the inputted data of 2 bits to data of 3 bits. The data converting circuit 20 outputs data of 3 bits×4 as a whole.

Table 1 shows an example of the data conversion of the data converting circuit 20.

TABLE 1

| Programming Data | I/O 0 | I/O 1 | DLU[1] | SL[1] | DLD[1] |
|---|---|---|---|---|---|
| 01 | 0 | 1 | 0 | 1 | 0 |
| 00 | 0 | 0 | 1 | 0 | 0 |
| 10 | 1 | 0 | 0 | 0 | 1 |
| 11 | 1 | 1 | 0 | 0 | 0 |

In Table 1: symbol DLU[1] designates the first data latch circuit DLT in the data latch column 12a disposed on the memory mat MAT(U) side; symbol SL[1] designates the first sense amplifier SA in the sense amplifier column 11; symbol DLD[1] designates the first data latch circuit DLT in the data latch column 12b disposed on the memory mat MAT(D) side.

As shown in Table 1, although the invention is not especially limited thereto, the programming data "01" is converted into data "010" of 3 bits. The programming data "00" is converted into data of 3 bits "100". The programming data "10" is converted into data of 3 bits "001". The programming data "11" are converted into data of 3 bits "000". Moreover, only the memory cell corresponding to the bit equivalent to the converted data "1" is programmed, but the memory cell corresponding to the bit equivalent to "0" of the converted data is not programmed.

The data of 3 bits, generated by converting the bits I/O0 and I/O1 of the programming data of 8 bits inputted first into the data converting circuit 20, is transferred to and latched by the data latch columns 12a and 12b arranged at the two ends (at the upper and lower parts in the drawing) of the memory array 10, and the first latch circuit of the sense amplifier column 11 arranged at the center of the memory array. The data of 3 bits, generated by converting the bits I/O2 and I/O3 of the programming data, is transferred to and latched by the data latch columns 12a and 12b arranged at the two ends (at the upper and lower parts in the drawing) of the memory array 10, and the second latch circuit of the sense amplifier column 11 arranged at the center of the memory array.

Likewise, the data, generated by converting the bits I/O4 and I/O5 of the programming data, is transferred to and latched by the data latch columns 12a and 12b and the third latch circuit of the sense amplifier column 11. The data, generated by converting the bits I/O6 and I/O7 of the programming data, is transferred to and latched by the data latch columns 12a and 12b and the fourth latch circuit of the sense amplifier column 11. The programming data next inputted is converted by the data converting circuit 20 and is transferred to and latched by the data latch columns 12a and 12b and the fifth to eighth bits of the sense amplifier column 11.

When data is stored in all the data latch columns 12a and 12b and the sense amplifier column 11 by repeating the operation described above, the later-described control circuit disposed in the memory starts the programming sequence to execute the programmings of the data latched in the sense amplifier column 11, the data of the sense amplifier column 12a and the data of the sense amplifier column 12b in this order. The control circuit is constructed to perform the control in accordance with a command inputted from the external CPU or the like. The data latch circuit DLT need not be disposed on the memory array 10 side, but may be disposed on the data converting circuit 20 side so that the data may be transferred to/from the sense amplifier SA at the programming or reading time.

Figure 19:
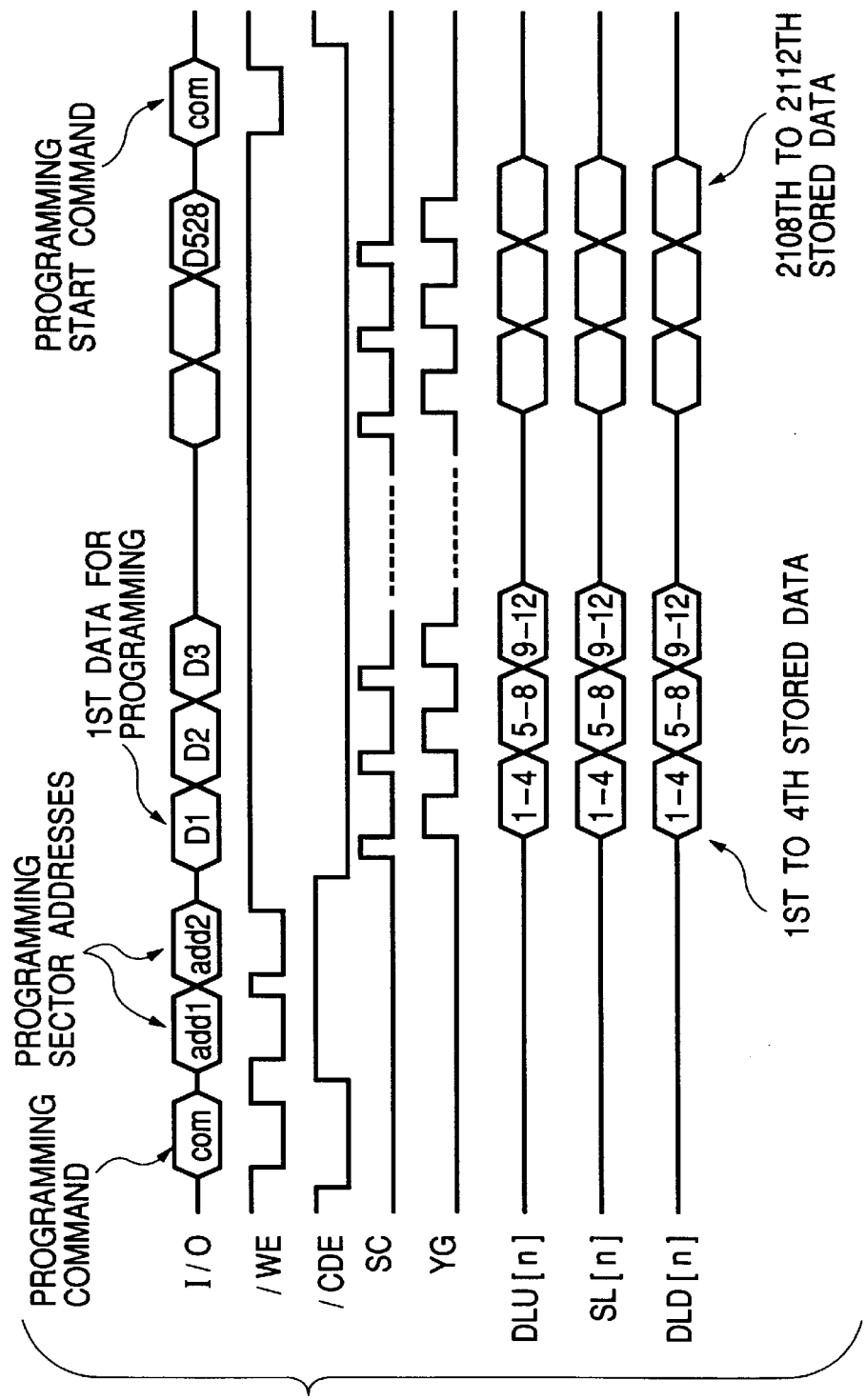
FIG. 19 is a timing chart illustrating data input timings at the time of programming the multivalue flash memory of the embodiment.

FIG. 19 illustrates timings at the data programming time. At the programming time, the programming command is inputted first, and sector addresses add1 and add2 to be programmed are then inputted, so that they are taken in synchronously with the fall of a write enable signal /WE. At this time, the commands and the addresses are discriminated by the control signal (command data enable signal) /CDE inputted simultaneously therewith. When the signal /CDE is at an active level, such as a low level, specifically, it is judged that the commands or data are inputted. When the signal /CDE is at an inactive level, such as a high level, on the other hand, it is judged that the addresses are inputted.

Subsequent to inputting the addresses, the first programming data D1 of 8 bits to be stored in one sector (the number of memory cells connected to one word lines is 528×8) are inputted and taken in by the input buffer 21 in synchronism with a clock SC. After the data conversion by the data converting circuit 20, moreover, the transmission gates TG1 to TG3 are opened in response to a gate control signal YG, and consequently the programming data of 3 bits×4 is sequentially transferred to and latched by the data latch columns 12a and 12b and the sense amplifier column 11. After this, programming data D2, D3, . . . and D528, inputted in units of 8 bits, is sequentially converted and latched in the sense amplifier column 11 and the data latch columns 12a and 12b. When the transfer of the programming data of one sector is ended, a programming start command is inputted from the outside and is taken in. The data of one sector is simultaneously programmed by decoding the command to execute the programming sequence.

In the memory array 10, a programming operation is performed, i.e., programming pulses are applied to the memory elements which are connected to the data lines having data "1" stored in the sense amplifier column 11, and the threshold values of the memory elements are shifted, as shown in FIG. 15, so that the data of 2 bits expressed by one of the four threshold values can be programmed in one memory cell.

Figure 20:
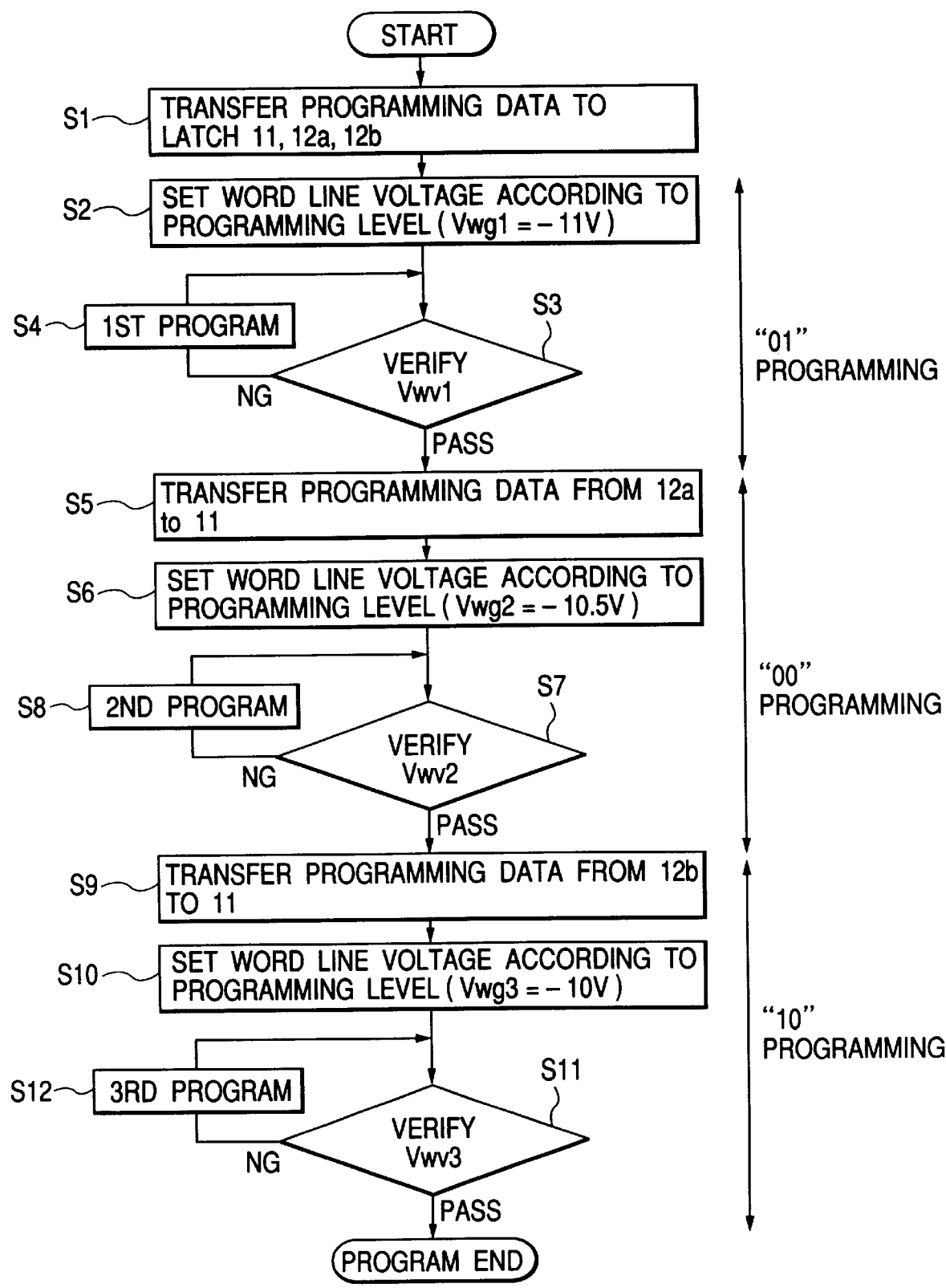
FIG. 20 is a flowchart showing one example of the programming procedure of the multivalue flash memory of the embodiment.

At the first step S1 (to transfer the programming data to the latches 11, 12a and 12b) in FIG. 20, the data is transferred from the data converting circuit 20 to the sense amplifier column 11 and the data latch columns 12a and 12b. At the second step S2 and later, a control sequence started when the programming start command is inputted is executed.

In this control sequence, the selected word line is set to the word line voltage such as −11 V by decoding the programming address already taken in (at step S2). At the same time, the transmission MOSFET Qt1 on the data line is turned on, and the data line having data "1" is set to a voltage such as +5 V for the programming in accordance with the data latched in the sense amplifier column 11. Next, the data line is precharged to a voltage such as +1 V, and the selected word line is then set to a voltage such as +15 V, and a verify reading operation for verifying the programming is performed. At this time, the data, read out from the memory cell having ended the programming normally to the sense amplifier column 11, is changed to "0". It is, therefore, judged (at step S3) whether or not all the latched data of the sense amplifier column 11 is "0". If even one data "1" is left, the programming is executed again by using the data latched in the sense amplifier column (at step S4).

If all the data of the sense amplifier column 11 is "0" as a result of the verification, the routine advances to step S5. At step S5, the data, latched in the data latch column 12a, is transferred to the sense amplifier column 11. This data transfer from the data latch column 12a to the sense amplifier column 11 can be performed by using the transmission MOSFET Qt1 on the data line. Then, the voltage of the selected word line is set to a voltage such as −10.5 V slightly lower than the previous one (at step S6).

Next, the programming is executed on the basis of the data latched in the sense amplifier column 11, the selected word line is set to a voltage such as ±2.5 V to effect the verification. It is then judged (at step S7) whether or not all the latched data of the sense amplifier column 11 is "0". If even one of the data latched in the sense amplifier column 11 is left, the programming is executed again (at step S8) by using the data latched in the sense amplifier column 11.

If all the data of the sense amplifier column 11 is "0" as a result of the verification, the routine advances to step S9. At step S9, the data, latched in the data latch column 12b, is transferred to the sense amplifier column 11.

Then, the selected word line is set to a voltage such as −10 V slightly lower than the previous one (at step S10). Next, the programming is carried out on the basis of the data latched in the sense amplifier column 11, the selected word line is set to a voltage such as ±3.3 V to effect the verification. After this, it is judged (at step S11) whether or not all the latched data of the sense amplifier column 11 is "0". If even one of the data latched in the sense amplifier column 11 is left, the programming is performed again (at step S12) by using the data latched in the sense amplifier column 11.

By the procedure thus far described, the programmings are sequentially executed from the memory cell having a threshold value which is most different from the erase level to the memory cell having a threshold value close to the same, thereby ending the programming. For the programming, however, it is possible, instead of lowering the programming voltage gradually, to reduce the programming pulse width gradually.

In the flash memory in which the memory cells have one of the four threshold values and in which one memory cell is made to store data of 2 bits, the data of 2 bits is read out in the following manner.

The data of the memory cells is read out by changing the potential of the selected word line, i.e., the potential of the control gate of the memory cell consecutively in three steps (i.e., an intermediate value between the threshold values). In this case, the voltage of +1 V is applied to the drain of the selected memory cell through the data line DL, and the local source line LSL is connected to the ground potential point of the circuit.

Since the memory cell having a lower threshold value than that of the word lines, the potential of the data line, connected to the memory cell, is discharged from the precharge level (1 V) to the ground potential. Since the memory cell having a higher threshold value than that of the word lines is turned off, on the other hand, the potential of the data line, connected to the memory cell, is kept at the precharge level (1 V). The potential of this data line is detected and amplified by the sense amplifier SA, so that primary read data are obtained.

In the data inverse conversion, the level of the selected word line is set to ±3.5 V to read out the data from the selected memory cell to the latch circuit of the sense amplifier column 11, and the data in the latch circuit is transferred to and latched in the data latch column 12a. Next, the level of the selected word line is set to ±2.7 V to read out the data from the selected memory cell to the latch circuit of the sense amplifier column 11, and the data in the latch circuit is transferred to and latched in the data latch column 12b. Finally, the level of the selected word line is set to ±1.7 V, and the data is read out from the selected memory cell and latched in the sense amplifier column 11. By thus changing the level of the selected word line in time series in three steps, three kinds of data are sequentially read out from the same memory cell and are latched in the data latch columns 12a and 12b and the sense amplifier column 11. As a result, the same read data as the programmed data can be restored in units of 2 bits through an inverse conversion by logically operating on the data read out.

The word line potential at the data reading time may be sequentially changed in time series in the order of 1.7 V, 2.7 V and 3.5 V.

Table 2 shows the stored data of the memory cells, their primary read data and the inversely converted read data.

TABLE 2

|  | 1st Read | 2nd Read | 3rd Read | Read Data | |
| --- | --- | --- | --- | --- | --- |
| Memory Data | Vwr = 3.5V | Vwr = 2.7V | Vwr = 1.7V | I/O 0 | I/O 1 |
| 01 | 0 | 0 | 0 | 0 | 1 |
| 00 | 0 | 0 | 1 | 0 | 0 |
| 10 | 0 | 1 | 1 | 1 | 0 |
| 11 | 1 | 1 | 1 | 1 | 1 |

The inverse conversion may be executed by providing such a logic operation circuit in the data converting circuit 20, but it also can be executed by using the data lines in the memory array 10 to take a wired logic (a logical OR or exclusive OR) between the data latched in the data latch columns 12a and 12b and the sense amplifier column 11. Moreover, the reading is executed in response to a reading command.

The sequential change, as described above, of the word line voltages at the data reading time may be modified into a change in the order of a first voltage of 1.7 V, a second voltage of 2.7 V and a third voltage of 3.5 V.

Figure 17:
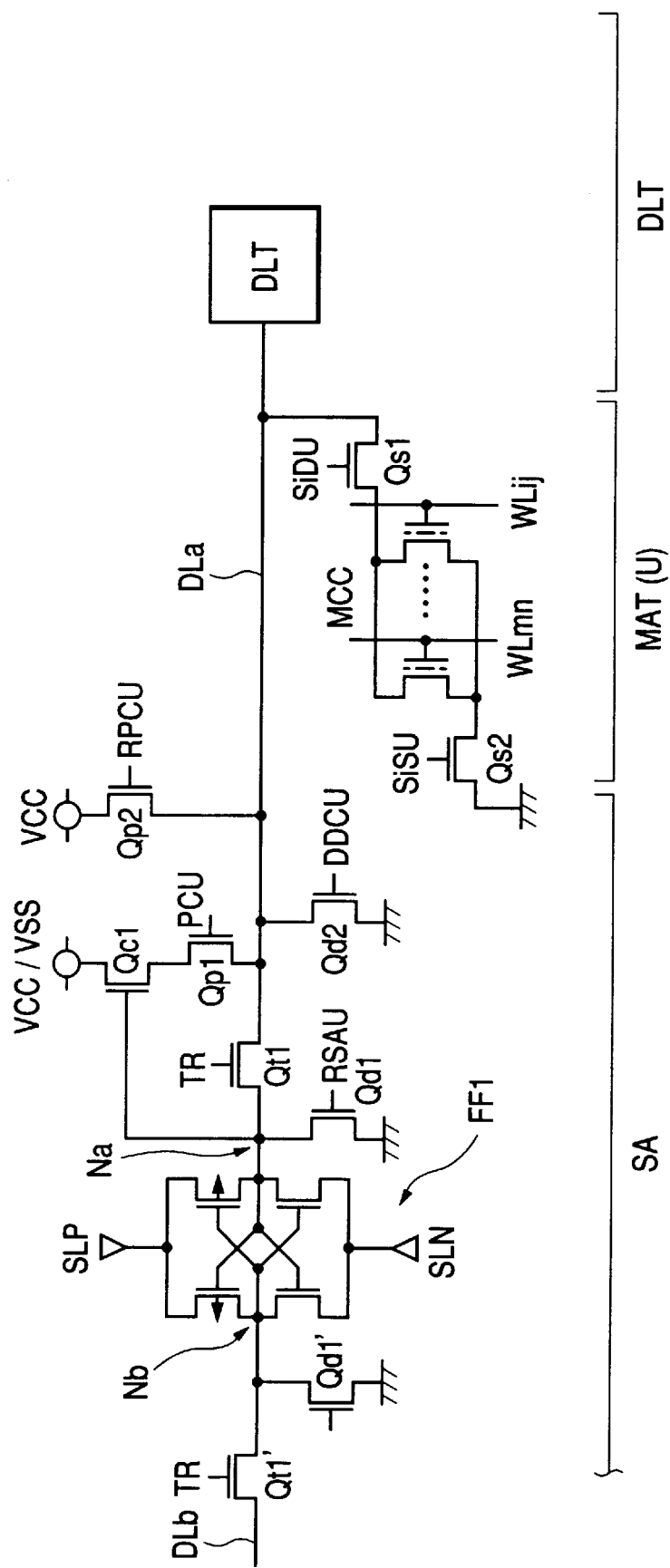
FIG. 17 is a circuit diagram showing one example of a memory array and a sense amplifier SA of a multivalue flash memory according to the invention.
Figure 26:
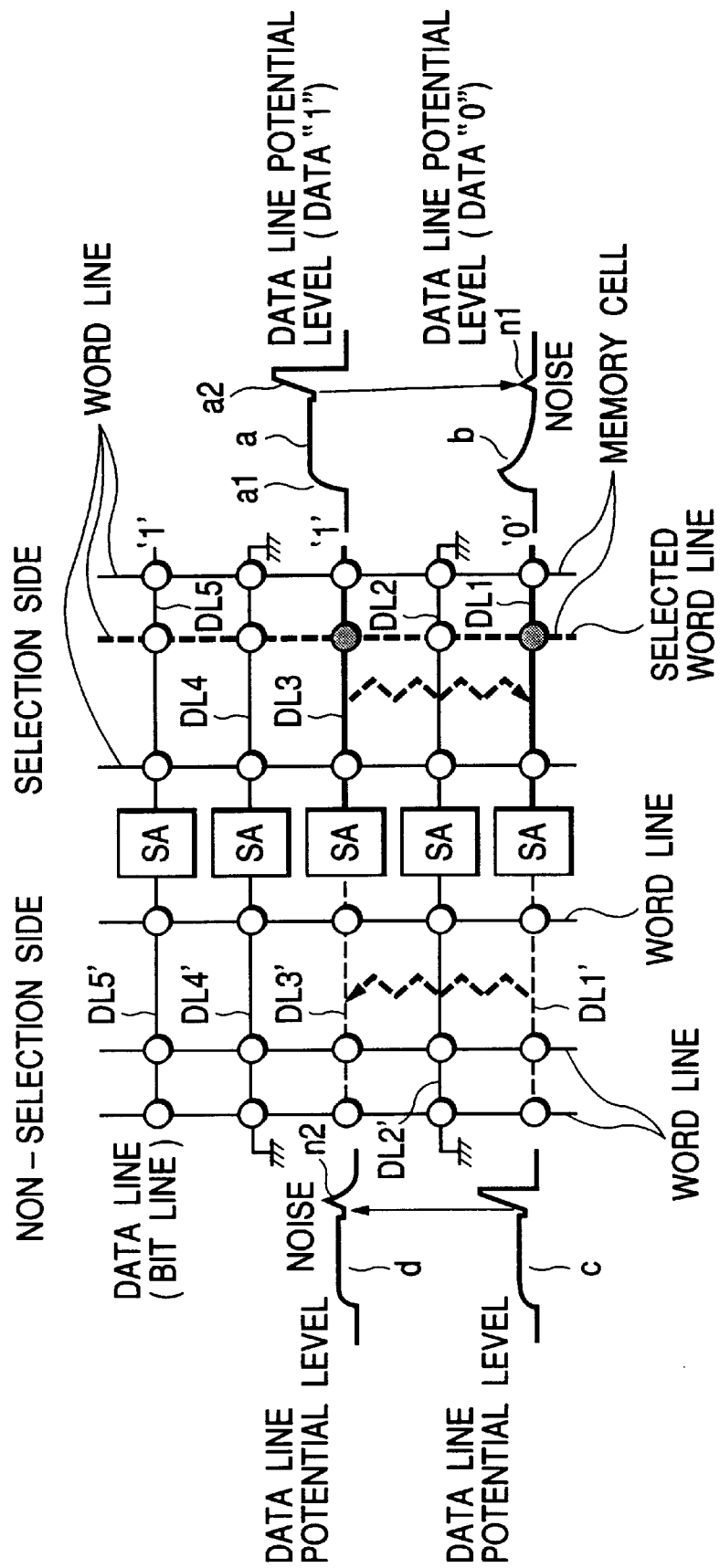
FIG. 26 is an explanatory diagram for explaining the noise generating mechanism clarified by us, in the flash memory.
Figure 27:
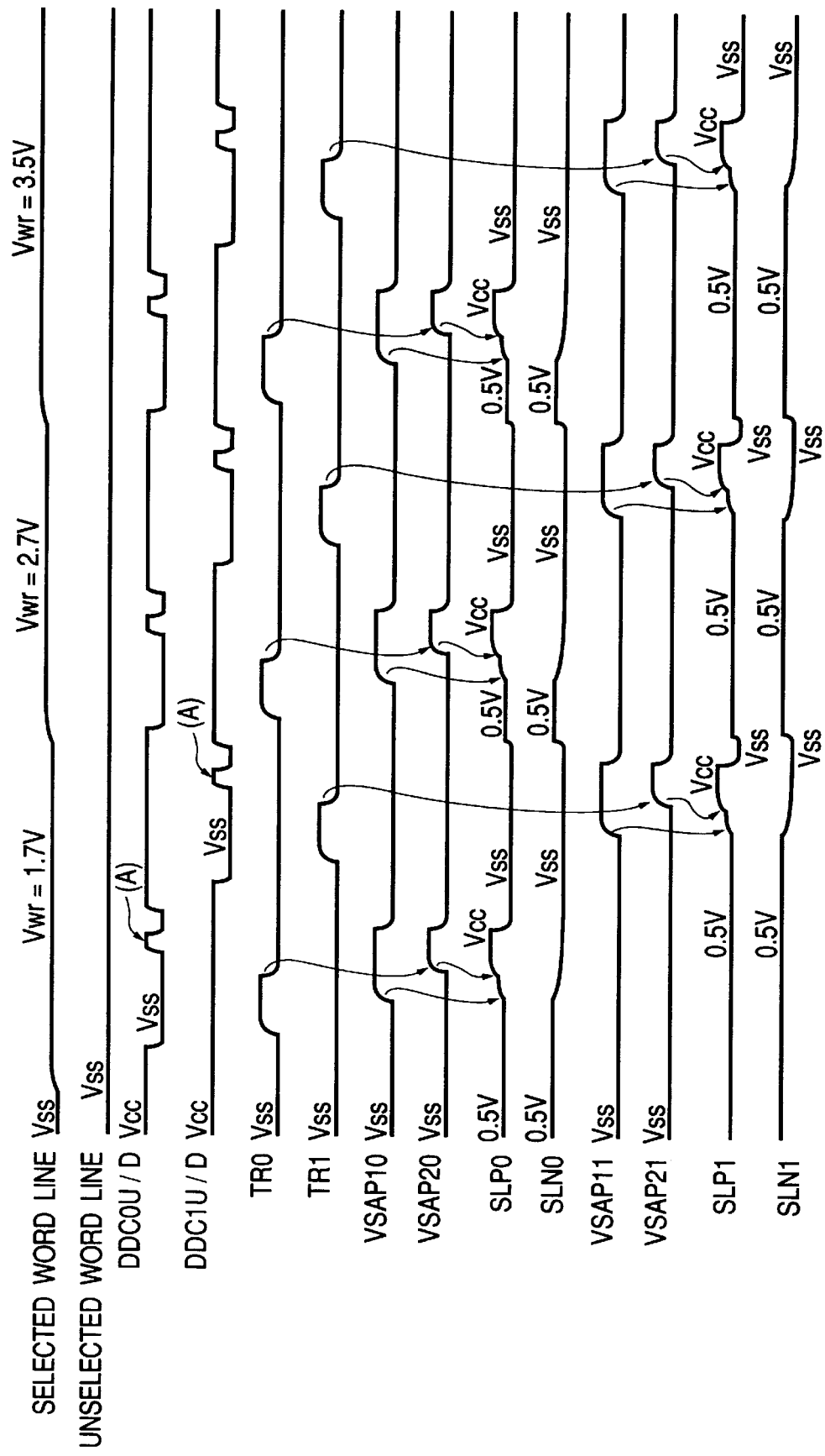
FIG. 27 is a timing chart illustrating the timing action of a sense amplifier in a multivalue flash memory of the bit line shield system according to the invention.

FIG. 27 is a schematic timing chart of the operation timings of the sense amplifier SA and the ON/OFF timings of the data transmission MOSFETs (the transfer MOSFETs corresponding to those Qt1 and Qt1' shown in FIG. 17). FIG. 26 shows the case in which data is to be read out from the memory cells in the memory mat MAT(U).

Figure 28:
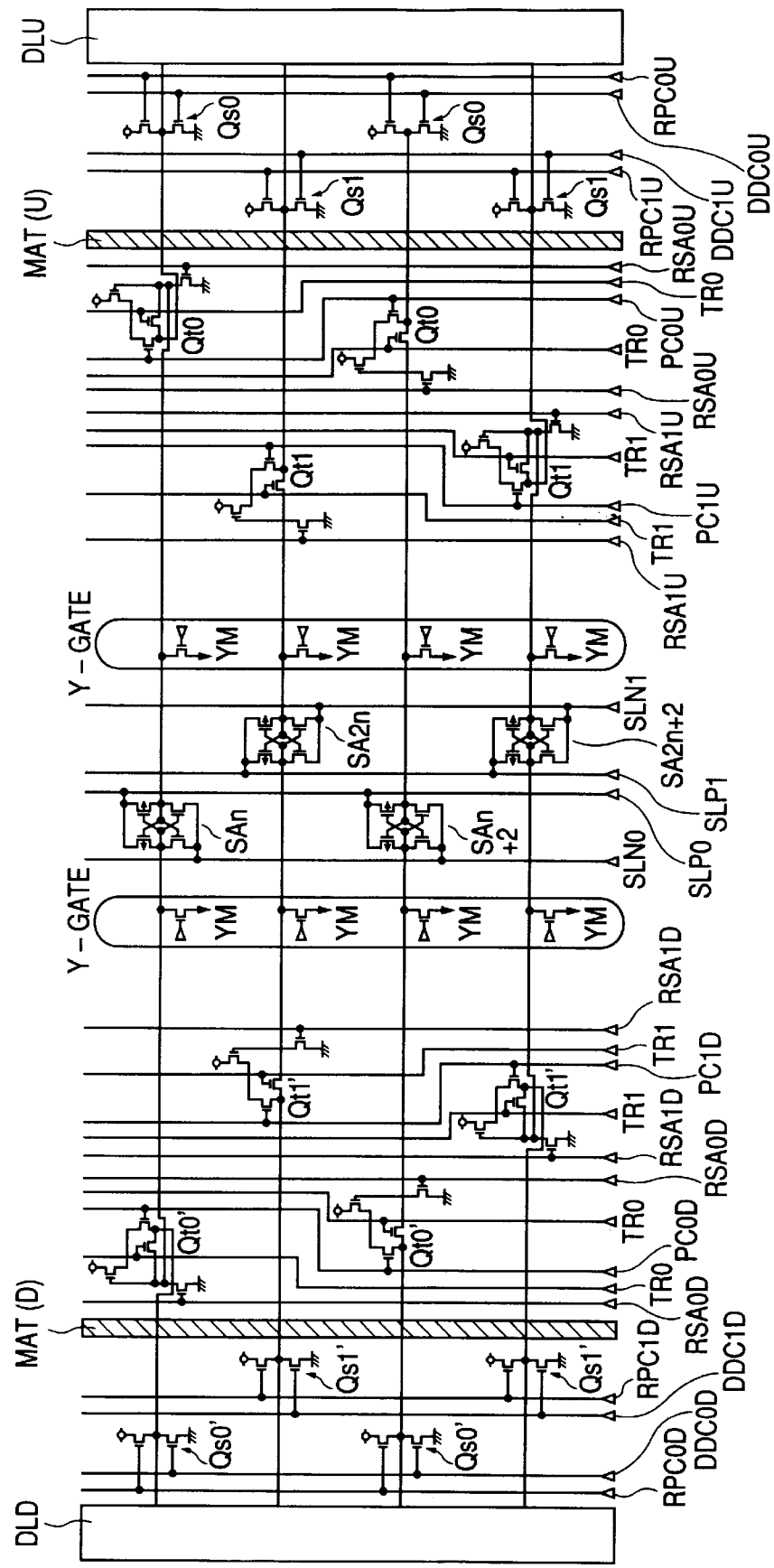
FIG. 28 is a circuit diagram showing a memory array and a peripheral circuit in the multivalue flash memory of the bit line shield system according to the invention.

FIG. 28 shows a circuit diagram of a multivalue flash memory controlled at the timings illustrated in FIG. 27. At first, a description thereof will be made with reference to FIG. 28.

In the circuit diagram shown in FIG. 28, the devalue flash memory shown in FIG. 3 is applied to the multivalue flash memory. Each data line is connected at one end to the sense amplifier (SAn, SAn+2, SA2n and SA2n+2) and is coupled at its other to data latch circuits DTU and DTD (see FIG. 18). When data are to be read out by using the sense amplifiers SAn and SAn+2, as has been described with reference to FIG. 3, the control signals with "0" are selectively activated at predetermined timings. When data is to be read out from a plurality of memory cells in the memory mat MAT(U), the control signals having "OU" are used. When data is to be read out from a plurality of memory cells in the memory mat MAT(D), the control signals having "OD" are used. Since data is read out by using the sense amplifiers SAn and SAn+2, control signals DDC1U and DDC1D are set to high levels. As a result, the even data lines corresponding to sense amplifiers SA2n and SA2n+2 are set to the ground potential to fulfill the function as a shield line. It is deemed that the control signals SLN0 and SLP0 for activating the sense amplifiers SAn and SAn+2 are generated by the not-shown first sense amplifier power supply circuit having a circuit construction similar to that of the sense amplifier power supply circuit PSP shown in FIG. 8. It is further deemed that the control signals of the first sense amplifier power supply circuit are VSAP10 and VSAP20 such that "0" is attached to the first and second control signals VSAP1 and VSAP2 shown in FIG. 8.

When data is to be read out by using the sense amplifiers SA2n and Sa2n+2, the control signals with "1" are selectively activated at predetermined timings. When data is to be read out from a plurality of memory cells in the memory mat MAT(U), the control signals having "1U" are used.

When data is to be read out from a plurality of memory cells in the memory mat MAT(D), the control signals having "1D" are used. Since data is read out by using the sense amplifiers SA2n and SA2n+2, control signals DDCOU and DDCOD are set to the high level. As a result, the odd data lines corresponding to sense amplifiers SAn and SAn+2 are set to the ground potential to fulfill the function as a shield line. It is deemed that control signals SLN1 and SLP1 for activating the sense amplifiers SA2n and SA2n+2 are generated by a not-shown second sense amplifier power supply circuit having a circuit construction similar to that of the sense amplifier power supply circuit PSP shown in FIG. 8. It is further deemed that the control signals of the first sense amplifier power supply circuit are VSAP11 and VSAP21 such that "1" is attached to the first and second control signals VSAP1 and VSAP2 shown in FIG. 8.

As shown in FIG. 27, the voltage of the selected word line is sequentially changed in time series into a first voltage of 1.7 V, a second voltage of 2.7 V and a third voltage of 3.5 V, although the invention is not especially limited thereto.

When the voltage of the selected word lines is set to 1.7 V, the odd data lines are selected first. Thus, the control signals DDCOU/D for controlling the operation of transistors Qs0 and Qs0' (see FIG. 28) serving as short MOSFETs on the odd data lines are changed from the high level such as the power voltage Vcc to the ground potential Vss (GND). The control signals DDC1U/D for controlling the operation of transistors Qs1 and Qs1' (see FIG. 28) serving as short MOSFETs on the even data lines are kept at the high level such as the power voltage Vcc. As a result, the even data lines are set to the ground potential Vss (GND) to function as shielded lines. By a local drain line selecting signal SiDU shown in FIG. 17, the local drain line LDL of each memory cell column MCC is then coupled to the selected data line, and the read data of the selected memory cell is read out to the selected data line. A control signal TR0 is selectively set to the high level, so that transmission MOSFETs Qt0 and Qt0' are selectively turned on.

When the control signal TR0 is selectively set to the high level, a first control signal VSANP10 of the first sense amplifier power supply circuit changes to the high level. In response to the change of the control signal TR0 to the low level, a first control signal VSANP20 of the first sense amplifier power supply circuit changes to the high level. As a result, the voltages on the power supply voltage sides of the sense amplifiers SAn and SAn+2 change in two steps, as shown, so that the data of the selected memory cell when the selected word line has a voltage of 1.7 V is read out to the sense amplifiers SAn and SAn+2. After the data is read out to the sense amplifier SAn and SAn+2, the control signals DDCOU/D are temporarily set to the high level, indicated by (A) of FIG. 27, and the data line voltage is set to the low level such as the ground potential Vss (GND).

After this, the control signals DDCOU/D are set to the high level to turn on the transistors Qs0 and Qs0' serving as the short MOSFETs on the odd data lines. Meanwhile, the control signal DC1U/D is set to the low level to turn off the transistors Qs1 and Qs1' as the short MOSFETs on the even data lines. As a result, the odd data lines are set to a potential such as the ground potential Vss (GND) to function as shield lines. Thus, the data is read out by using the even data lines.

After this, in response to the local drain line selecting signal SIDU shown in FIG. 17, the local drain line LDL of each memory cell column MCC is coupled to the selected data line, so that the read data of the selected memory cell is read out to the selected data line. A control signal TR1 is selectively set to the high level to turn on the transmission MOSFETs Qt1 and Qt1' selectively. When the control signal TR1 is selectively set to the high level, a first control signal VSANP11 of the second sense amplifier power supply circuit changes to the high level.

In response to the change of the control signal TR1 to the low level, a first control signal VSANP21 of the second sense amplifier power supply circuit changes to the high level. As a result, the voltages on the power sides of the sense amplifiers SA2n and SA2n+2 change in two steps, as shown, so that the data of the selected memory cell when the selected word line has a voltage of 1.7 V are read out to the sense amplifiers SA2n and SA2n+2. After the data is read out to the sense amplifier SA2n and SA2n+2, the control signals DDCOU/D are temporarily set to the high level, as indicated by (A) of FIG. 27, and the data line voltage is set to the low level such as the ground potential Vss (GND).

After this, the data, latched in the sense amplifiers SAn, SAn+2, SA2n and SA2n+2, is transferred to the data latch circuit DTU, for example.

After this, the level of the selected word line is changed to 2.7 V, and the data is read out by using the odd data lines like before and then by using the even data lines. The data of the memory cell, read out by the level of 2.7 V of the selected word line, is transferred from the sense amplifiers SAn, SAn+2, SA2n and SA2n+2 to the data latch circuit DTD, for example.

Next, the level of the selected word line is changed to 3.5 V, and the data is read out by using the odd data lines like before and then by using the even data lines. The data of the memory cell, read out by the level of 3.5 V of the selected word line, is transferred from the sense amplifiers SAn, SAn+2, SA2n and SA2n+2.

After this, the data is inversely converted and fed to the outside of the flash memory such as the microprocessor.

In this multivalue flash memory, one of 2 bit data "00", "01", "10" and "11" is stored in one memory cell as the corresponding threshold level. For this purpose, the levels of the programming threshold values corresponding to the individual data are minutely controlled. This multivalue flash memory has a narrow difference in the threshold value set for storing the individual data, compared to that of the flash memory for storing data of 1 bit such as "0" or "1" in one memory cell. Therefore, it is sensitive to noise at the time of reading out the data from the memory cells. In accordance with the invention, the power supply voltage of the sense amplifier is changed in two steps, so that the potential change of the data lines can be restricted and noise is suppressed like before. This makes it possible to read out data correctly even if the threshold values set for storing the data have a narrow difference, like multivalue flash memories.

Figure 21:
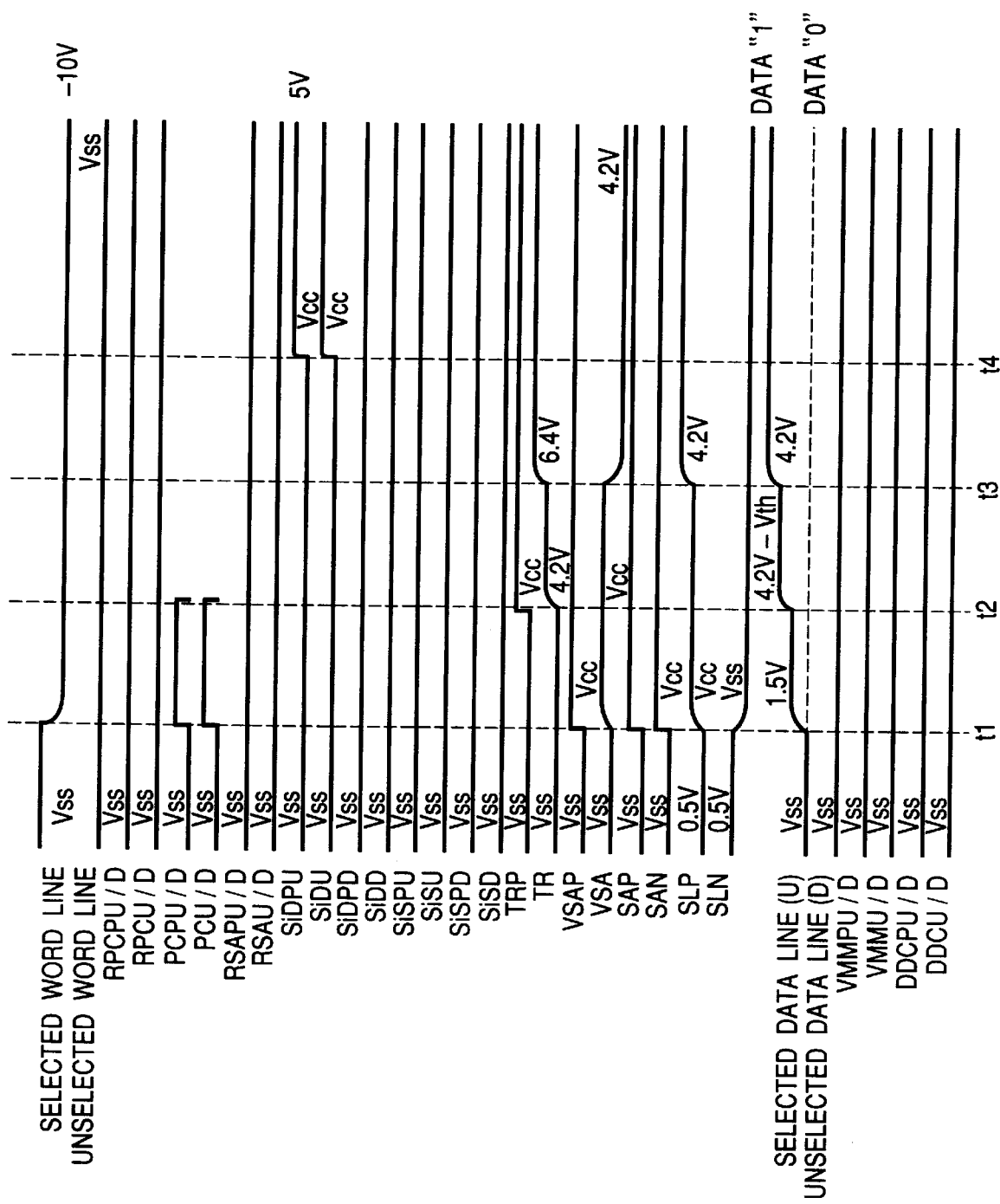
FIG. 21 is a timing chart illustrating signal timings at the data programming time in the multivalue flash memory of the embodiment.

FIG. 21 illustrates the change of the signals in the memory array at the data programming time. At this programming time, the selected word line is set first to a voltage such as −10 V, and the sense amplifier SA is fed with the Vcc (5 V) and Vss as the operating voltages SLP and SLN, so that it is activated to latch the data corresponding to the programming data fed to the input/output terminals. In response to the control signal PCU, the precharge MOSFET Qp1 is turned on and the data line DL is precharged to 1.5 V or 0 V in accordance with the latched data of the sense amplifier SA (at timing t1).

Next, the precharge MOSFET Qp1 is turned off, and the data transmission MOSFET Qt1 is turned on in turn in response to the control signal TR at 4.2 V to connect the data line to the sense amplifier (at timing t2). Since the sense amplifier SA is fed at this time with the voltage Vcc (5 V) as the operating voltage SLP, the voltage of 1.5 V of the data line is raised to a level which is lower by the threshold voltage Vth than the control signal TR of 4.2 V.

After this, the gate control signal TR of the data transmission MOSFET Qt1 is raised to a voltage of 6.4 V, and the operating voltage SLP of the sense amplifier SA is dropped to a voltage of 4.2 V (at timing t3). As a result, the voltage of the precharged data line is set to 4.2 V. Then, the control signal SiDU is charged to the high level to turn on the selected switch MOSFET Qs1, and the data of the data line DL is transmitted to the local drain line LDL and further to the drain of the selected memory cell to extract the charge from the floating gate, i.e., to program the data "1" (at timing t4). In the meantime, the selected switch MOSFET Qs2 on the source side of the memory cell is kept off using the control signal SiSU, so that the programming is executed, with the source of the selected memory cell kept open.

FIG. 22 shows an example of the entire construction of a multivalue flash memory which is equipped on a common semiconductor chip with the memory array 10, the data converting circuit 20, the control circuit and the memory peripheral circuit thus far described.

The flash memory of this embodiment is constructed, although the invention is not especially limited thereto, to include: a command decoder 31 for decoding a command fed from an external CPU or the like; and a control circuit (sequencer) 32 for generating and outputting control signals to the circuits in the memory so that the processings according to various commands may be executed on the basis of the decoding result of the command decoder 31. The flash memory decodes a command and executes the corresponding processing automatically. The control circuit 32 has a ROM (Read Only Memory) which is stored with a series of micro-instructions necessary to execute the command as in the control unit of a microprogram CPU, for example, so that the command decoder 31 may generate the first address of the micro-instruction group corresponding to the command and fed to the control circuit 32, thereby starting a microprogram.

In FIG. 22, circuit portions, designated by the same reference numerals and symbols as those of FIG. 16, are circuits having identical functions. Specifically: reference numeral 10 designates the memory array having two memory mats MAT(U) and MAT(D); numeral 20 designates a data converting circuit for converting programming data inputted from the outside into quaternary data for every two bits; numeral 11 designates a sense amplifier column for latching programming data and read data converted; and symbols 12a and 12b designate data latch columns.

The memory array 10 is equipped with X-address decoders 13a and 13b corresponding to the memory mats MAT(U) and MAT(D), and word drive circuits 14a and 14b for driving one word line WL in each memory mat MAT(U) to a selected level in accordance with the decoding results of the decoders 13a and 13b. In the memory array 10 of this embodiment, the word drive circuits are arranged along the two sides of each memory mat and at the center, although the invention is not especially limited thereto. Y-address decoders and column switches selectively turned on/off by the Y-address decoders, for transferring the data from the data converting circuit 20 to the corresponding sense amplifier, are provided integrally with the sense amplifier column 11, although not shown in FIG. 16 or FIG. 17. FIG. 22 shows the Y-address decoders, the column switches and sense amplifier circuits in one function block Y DEC&SLT.

The multivalue flash memory of this embodiment is equipped, in addition to the aforementioned circuits, with a program/erase judging circuit 33 for judging whether or not the programming/erasure operation has ended on the basis of the data of the sense amplifier column 11 at the programming/erasing time thereby to inform the control circuit 32 of the judgment and to end the programming sequence or the erasing sequence; a clock generator 34 for generating a timing clock signal necessary for the internal operations to feed the timing clock signal to the circuits in the memory; a status & test circuit 35 having functions to generate and output a ready/busy signal RIB reflecting the status of the memory inside and representing whether or not an access from the outside is possible, and to test the internal circuits; a main amplifier circuit 36 for amplifying the signal read out from the memory array 10; a power supply circuit 37; an input/output buffer 38 for taking in the address signal, the programming data signal and the command inputted from outside, feeding them to predetermined circuits, and outputting the read data signal to the outside; a control signal input buffer & input/output control circuit 39 for taking in the control signal inputted from the outside, feeding them to the control circuit 32 and other predetermined internal circuits, and controlling the input/output buffer 38; an address control circuit 40; and a redundancy circuit 41 for replacing a memory row by a preparatory one when a defective bit is in the memory array.

In the flash memory of this embodiment, the address signal, the programming data signal and the command share external terminals (pins) I/O. For this, the input/output buffer circuit 38 discriminatingly takes in those input signals in accordance with the control signals coming from the control signal input buffer & input/output control circuit 39 and feeds them to predetermined internal circuits. Moreover, the power supply circuit 37 is constructed to include: an internal power supply voltage generator having a reference power supply voltage generator for generating a reference voltage such as a substrate potential and a charge pump for generating voltages such as a programming voltage, an erasing voltage, a reading voltage or a verifying voltage needed in the chip from the power supply voltage Vcc fed from the outside; a power supply switching circuit for selecting a desired voltage from those voltages in accordance with the operating status of the memory to feed it to the memory array 10; and a power control circuit for controlling the foregoing circuits.

The address control circuit 40 is constructed to include: an address counter ACNT for taking in and counting up address signals inputted from the outside; an address generator AGEN for updating the Y-address automatically at the data transferring time and generating the X-address automatically at the data erasing time; and a repair circuit comparing the input address with the failure address to switch the row or column of the selected memory when the addresses agree with each other.

The control signals to be inputted from the external CPU or the like to the flash memory of this embodiment include a reset signal RES, a chip select signal CE, a programming control signal WE, an output control signal OK, a command enable signal CDE for representing whether the input is a command, a data input or an address input, and a system clock SC.

The external device for controlling the multivalue flash memory of the foregoing embodiments can be a general purpose microcomputer LSI because it only must be provided with an address generating function and a command generating function.

Figure 23:
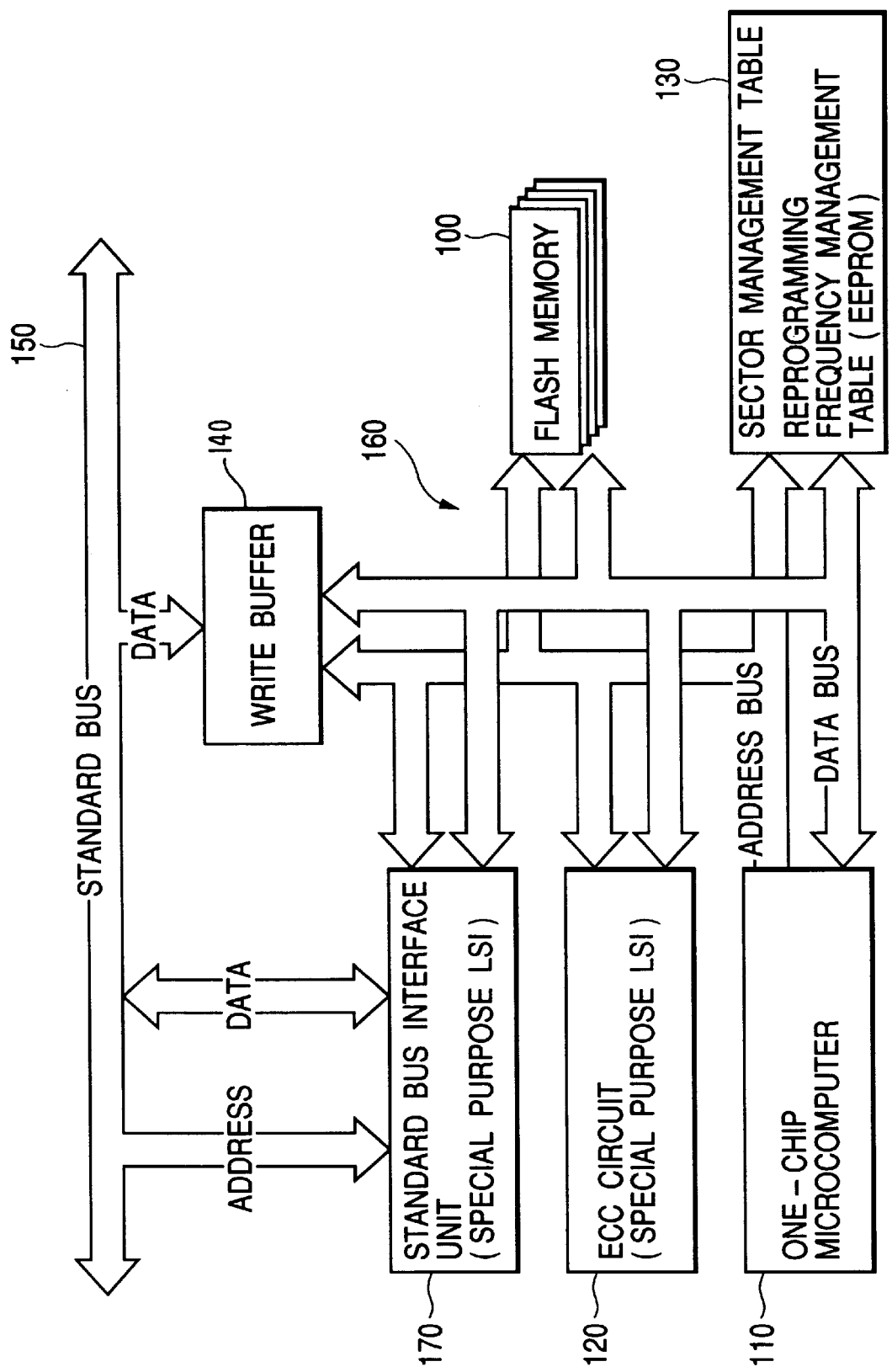
FIG. 23 is a block diagram showing one example of an application system of the multivalue flash memory according to the invention.
Figure 24:
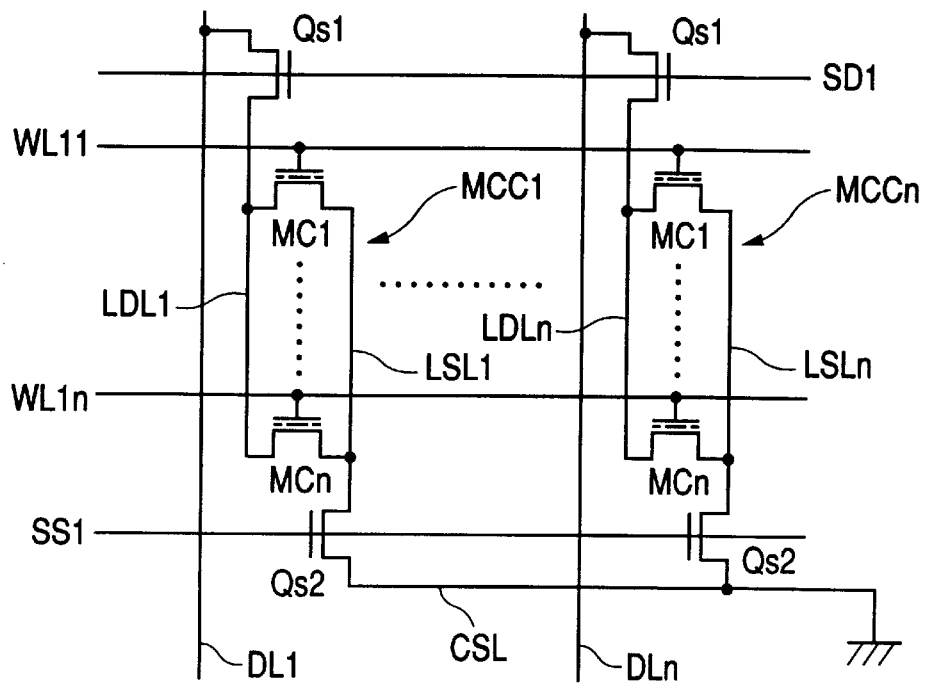
FIG. 24 is a circuit diagram showing one example of the construction of a memory array, investigated by us, in a flash memory.
Figure 25:
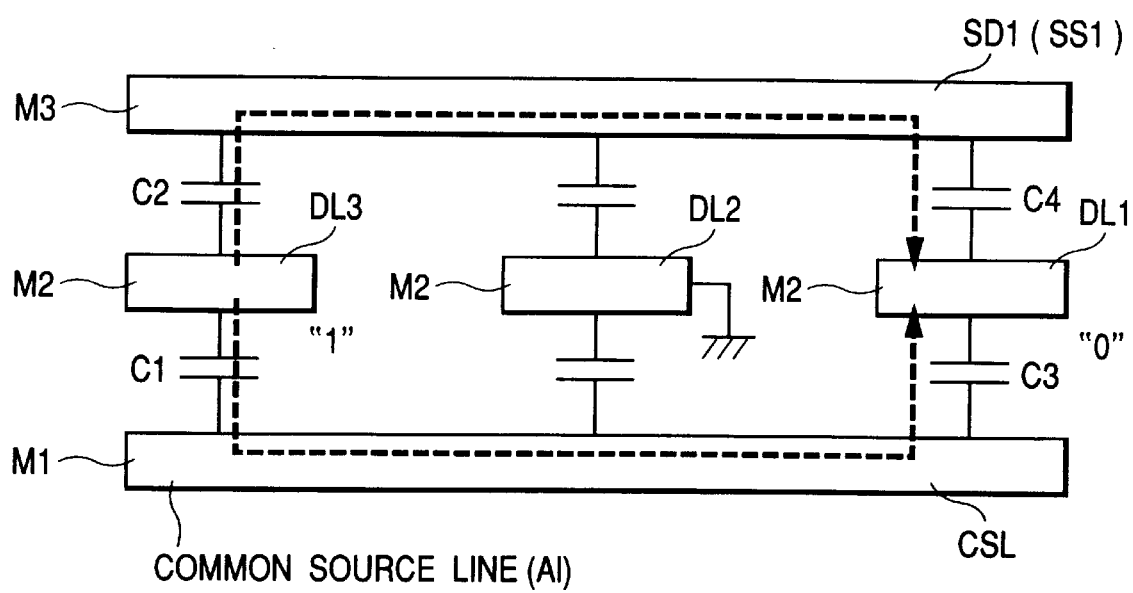
FIG. 25 is a conceptual diagram for explaining the noise generating mechanism clarified by us, in the flash memory.

FIG. 23 shows an example of-the construction of a system employing the flash memory as a memory device. Since the data is latched in the flash memory even if the power of the system is turned off, this is a control system suitable for a portable external memory device such as a PC card or a portable electronic device.

In FIG. 23: the system includes a flash memory 100; a one-chip microcomputer 110 serving as a semiconductor data processor which controls the reading, programming and erasing of the data of the flash memory 100; an ECC (error correcting code) circuit for generating an error correcting signal at the data programming time of the flash memory and for checking the read data at the data reading time to correct errors; a management table memory 130 having an EEPROM or the like for storing the data reprogramming frequency of the flash memory 110 in a table format; a write buffer 140 for temporarily storing the programming data fed through a standard bus 150 from a not-shown microprocessor; local buses 160 for connecting the one-chip microcomputer 110, the memories 100 and 130 and the ECC circuit 120; and a bus interface circuit for 170 interfacing the signals between the local buses 160 and the standard bus 150. In a portable external memory device, the aforementioned circuits are mounted over one substrate such as a plastic card. In a portable electronic device, the circuits are mounted over one substrate such as a printed circuit wiring board and are assembled together with a liquid crystal panel in a not-shown body casing.

In the foregoing embodiments, as has been described hereinbefore, the operation timings of the switch elements, interposed between the sense amplifier for amplifying the potentials of the data lines and the data lines, are controlled, the potentials of the data lines are transmitted to the sense amplifier, the switch elements are turned off, and then the operating voltage is fed to the sense amplifier to perform amplification. The potentials of the data lines are not raised by the amplifying operation of the sense amplifier to reduce the noise transmitted to the data line adjacent to the adjoining data line through the parasitic capacitance created between the data lines comprising a second metal layer and the signal lines comprising first to third metal layers. This makes it possible to prevent erroneous reading of data.

There is provided means for feeding the power supply voltage selectively to the sense amplifier for amplifying the potentials of the data lines. The control voltage is lowered to lower the operating voltage of the sense amplifier. As a result, the potential change of the data lines by the sense amplifier is delayed to reduce the noise transmitted to the data line next to the adjoining data line through the parasitic capacitance created between the data lines of the second metal layer and the signal lines of the first to third metal layers. This is effective in preventing erroneous reading of data.

A plurality of means are provided for feeding the power supply voltage selectively to the sense amplifier for amplifying the potentials of the data lines. These power supply means are started with time shifts, so that the operating current of the sense amplifier is stepwise increased to avoid any abrupt change in the levels of the data lines. This reduces the noise transmitted to the data line next to the adjoining data line through the parasitic capacitance created between the data lines of the second metal layer and the signal lines of the first to third metal layers. This is effective in preventing erroneous reading of data. In the foregoing embodiments, when the threshold value of the selected memory cell is higher than the potential of the selected word line, the potential of the selected data line on the selected memory mat side changes from the precharge level of as low as 1 V to the power supply voltage of 5 V, and the potential of the selected data line on the non-selected memory mat side changes from a precharge potential of as low as 0.5 V to the ground potential of 0 V. As a result, since the potential change of the selected data line on the selected memory mat side is larger than that of the selected data line on the non-selected memory mat side, it is appropriate to provide a plurality of power supply means for feeding the power supply voltage Vcc selectively to the sense amplifier. It is not significant to provide a plurality of power supply means for feeding the ground potential GND selectively to the sense amplifier.

Although our invention has been specifically described in connection with various embodiments, it should not be limited thereto, but can naturally be modified in various ways without departing from the gist thereof.

The programming system for each memory cell should not be limited as in the embodiments to the system in which the threshold value is lowered with the programming pulse after first being raised by the erase operation, but may be one in which the threshold value is raised with the programming pulses. In the embodiments, moreover, the threshold value is changed by programming the memory cell which corresponds to the sense amplifier circuit latching the data "1", but it may be changed by programming the memory cell which corresponds to the sense amplifier circuit latching the data "0".

Moreover, the embodiments have been described, taking the case in which the memory array is constructed to include two mats, but the invention should not be limited thereto, but can be applied not only to the case in which the memory array is divided into a plurality of mats, but also to the case in which the memory array comprises one mat. The foregoing description has been made mainly of the case in which our invention is applied to a flash memory backgrounding its field of application. The invention should not be limited thereto, but can be widely utilized for semiconductor memory devices, such as dynamic RAMs.

The effect produced by a representative one of the features disclosed herein will be briefly described in the following.

In short, the invention can realize a semiconductor memory device such that erroneous reading is prevented by preventing noise from passing between the data lines through the parasitic capacitance of the data lines.

What is claimed is:

1. A simultaneous erasure type nonvolatile semiconductor memory device comprising:
    a semiconductor substrate;
    a plurality of memory cells formed over said semiconductor substrate and each including a control gate and a floating gate;
    a plurality of word lines coupled to the control gates of said plural memory cells;
    a plurality of data lines including a plurality of odd data lines and a plurality of even data lines and formed of a first metal wiring layer extending in a predetermined direction;
    a select transistor formed over said semiconductor substrate for coupling said plural memory cells and said plural data lines selectively;
    a control signal line fed with a control signal (SiDU/D) for controlling said select transistor, extending in a direction perpendicular to said predetermined direction, and formed of a second metal wiring layer different from said first metal wiring layer;
    a plurality of sense amplifiers including a plurality of odd sense amplifiers respectively coupled to said plural odd data lines and a plurality of even sense amplifiers respectively coupled to said plural even data lines;
    a plurality of transistors (Qd2, Qs0, Qs0', Qs1 and Qs1') for setting said even data lines to a predetermined potential when said odd sense amplifiers are activated whereas said even sense amplifiers are inactivated, and for setting said plural odd data lines to a predetermined potential when said even sense amplifiers are activated whereas said odd sense amplifiers are inactivated;
    a first power supply circuit for supplying said odd sense amplifiers with their operating voltage; and
    a second power supply circuit for supplying said even sense amplifiers with their operating voltage,
    wherein said first power supply circuit includes first and second output transistors having source/drain paths coupled to said odd sense amplifiers, and said second output transistor is selectively brought into an active state after said first output transistor is brought into an active state, and
    wherein said second power supply circuit includes third and fourth output transistors having source/drain paths coupled to said even sense amplifiers, and said fourth output transistor is selectively brought into an active state after said third output transistor is brought into an active state.

2. A simultaneous erasure type nonvolatile semiconductor memory device according to claim 1,
    wherein said first and second transistors are insulated gate field effect transistors, and said first output transistor has a gate width larger than that of said second output transistor, and
    wherein said third and fourth transistors are insulated gate field effect transistors, and said third output transistor has a gate width larger than that of said fourth output transistor.

3. A simultaneous erasure type nonvolatile semiconductor memory device according to claim 2, further comprising:
    a plurality of first transmission transistors (Qt0 and Qt0') for coupling said odd data lines selectively to said odd sense amplifiers; and
    a plurality of second transmission transistors (Qt1 and Qt1') for coupling said even data lines selectively to said even sense amplifiers,
    wherein said first transmission transistors are turned on before said first output transistors are turned on, and are turned off before said second output transistors are turned on, and
    wherein said second transmission transistors are turned on before said third output transistors are turned on, and are turned off before said fourth output transistors are turned on.

4. A simultaneous erasure type nonvolatile semiconductor memory device according to claim 3,
    wherein each of said plurality of memory cells is so programmed with data as to have one of threshold values.

5. A semiconductor memory device comprising:
    a plurality of first data lines;
    a plurality of memory cells each of which has a threshold voltage in accordance with stored data therein and is coupled to corresponding data line of said plurality of first data lines;
    a plurality of sense amplifiers, having a first group of odd numbered sense amplifiers which correspond to odd-numbered data lines of said plurality of first data lines and a second group even-numbered sense amplifiers which correspond to even-numbered data lines of said plurality of first data lines, each of said sense amplifiers amplifying data of selected memory cells by being applied with an operating voltage in a read operation; and
    a switch circuit receiving a first and a second control signal,
    wherein when said switch circuit receives said first control signal of a first state, said switch circuit couples said odd-numbered data lines to said first group of odd-numbered sense amplifiers and said first group of odd-numbered sense amplifiers are applied with said operating voltage of a first voltage level, and when said switch circuit receives said first control signal of a second state, said switch circuit uncouples said odd-numbered data lines from said first group of odd-numbered sense amplifiers and said first group of odd-numbered sense amplifiers are applied with said operating voltage of a second voltage level higher than said first voltage level, and wherein when said switch circuit receives said second control signal of said first state, said switch circuit couples said even-numbered data lines to said second group of even-numbered sense amplifiers and said second group of even- numbered sense amplifiers are applied with said operating voltage of said first voltage level, and when said switch circuit receives said second control signal of said second state, said switch circuit uncouples said even-numbered data lines from said second group of even-numbered sense amplifiers and said second group of even-numbered sense amplifiers are applied with said operating voltage of said second voltage level higher than said first voltage level.

6. A semiconductor memory device according to claim 5, further comprising a power supply circuit which generates said operating voltage of said first voltage level and said operating voltage of said second voltage level.

7. A semiconductor memory device according to claim 6, wherein said power supply circuit has a first power supply circuit generating said operating voltage of said first voltage level when a third control signal is applied thereto and a second power supply circuit generating said operating voltage of said second voltage level when a fourth control signal is applied thereto.

8. A semiconductor memory device according to claim 7, wherein said power supply circuit has an output outputting one of said operating voltage of said first voltage level and said operating voltage of said second voltage level, said first power supply circuit includes a first MOSFET transferring said operating voltage of said first voltage level to said output and said second power supply circuit includes a second MOSFET transferring said operating voltage of said second voltage level to said output, a gate width of said first MOSFET is smaller than a gate width of said second MOSFET.

9. A semiconductor memory device according to claim 8, wherein each of said plurality of sense amplifiers has a pair of input terminals, said switch circuit couples said plurality of first data lines to ones of said pair of input terminals of said plurality of sense amplifiers.

10. A semiconductor memory device according to claim 9, further comprising a plurality of second data lines, a plurality of memory cells each of which is coupled to a corresponding data line of a plurality of second data lines and a second switch circuit receiving said first and said second control signal.

11. A semiconductor memory device according to claim 10, further comprising a first precharge circuit coupled to said plurality of first data lines and a second precharge circuit coupled to said plurality of second data lines.

12. A semiconductor memory device according to claim 11, wherein said first precharge circuit precharges said plurality of first data lines to a precharge voltage having a predetermined potential and said second precharge circuit precharges said plurality of second data lines to a reference voltage having a potential lower than said precharge voltage.

13. A semiconductor memory device according to claim 12, wherein each of said plurality of sense amplifiers includes a flip-flop circuit.

14. A semiconductor memory device according to claim 13, wherein each of said memory cells is a nonvolatile memory cell.

15. A semiconductor memory device according to claim 14, wherein said nonvolatile memory cell includes a single MOSFET having a floating gate and a control gate.

16. A semiconductor memory device comprising:
a first data line;
a plurality of electrically erasable and programmable memory cells each of which is coupled to said first data line;
a sense amplifier executing an amplifying operation of data of a selected memory cell by being applied with an operating voltage in a read operation; and
a first switch circuit receiving a first control signal,
wherein, in said read operation, when said first switch circuit receives said first control signal of a first state, said first switch circuit couples said first data line to said sense amplifier, and said sense amplifier executes a first amplifying operation for data of a selected memory cell by being applied with said operating voltage of a first voltage level, and when said first switch circuit receives said first control signal of a second state, said first switch circuit uncouples said first data line from said sense amplifier, said sense amplifier executes a second amplifying operation for said data by being applied with said operating voltage of a second voltage level,
wherein an amplifying rate of said second amplifying operation is higher than an amplifying rate of said first amplifying operation.

17. A semiconductor memory device according to claim 16, further comprising a power supply circuit which generates said operating voltage of said first voltage level and said operating voltage of said second voltage level.

18. A semiconductor memory device according to claim 17, wherein said power supply circuit has a first power supply circuit generating said operating voltage of said first voltage level when a second control signal is applied thereto and a second power supply circuit generating said operating voltage of said second voltage level when a third control signal is applied thereto.

19. A semiconductor memory device according to claim 18, wherein said power supply circuit has an output outputting one of said operating voltage of said first voltage level and said operating voltage of said second voltage level, said first power supply circuit includes a first MOSFET transferring said operating voltage of said first voltage level to said output and said second power supply circuit includes a second MOSFET transferring said operating voltage of said second voltage level to said output, a gate width of said first MOSFET is smaller than a gate width of said second MOSFET.

20. A semiconductor memory device according to claim 19, wherein said sense amplifier has a pair of input terminals, said switch circuit couples said first data line to one of said pair of input terminals of said sense amplifier.

21. A semiconductor memory device according to claim 20, further comprising a second data line, a plurality of memory cells each of which is coupled to said second data line and a second switch circuit receiving said first control signal.

22. A semiconductor memory device according to claim 21, further comprising a first precharge circuit coupled to said first data line and a second precharge circuit coupled to said second data line.

23. A semiconductor memory device according to claim 22, wherein said first precharge circuit precharges said first data line to a precharge voltage having a predetermined potential and said second precharge circuit precharges said second data line to a reference voltage having a potential lower than said precharge voltage.

24. A semiconductor memory device according to claim 23, wherein said sense amplifier includes a flip-flop circuit.

25. A semiconductor memory device according to claim 24, wherein each of said memory cells is a nonvolatile memory cell.

26. A semiconductor memory device according to claim 25, wherein said nonvolatile memory cell includes a single MOSFET having a floating gate and a control gate.

27. A semiconductor memory device comprising:
a plurality of first data lines;
a plurality of electrically erasable and programmable memory cells each of which is coupled to a corresponding data line of said plurality of first data lines;
a plurality of sense amplifiers, having a first group of odd numbered sense amplifiers which correspond to odd-numbered data lines of said plurality of first data lines and a second group of even-numbered sense amplifiers which correspond to even-numbered data lines of said plurality of first data lines, each of said sense amplifiers executing an amplifying operation of data of selected memory cells by being applied with an operating voltage in a read operation; and
a switch circuit receiving a first and a second control signal,
wherein, when said switch circuit receives said first control signal of a first state, said switch circuit couples said odd-numbered data lines to said first group of odd-numbered sense amplifiers and said first group of odd- numbered sense amplifiers execute a first amplifying operation for data of selected memory cells coupled to said odd-numbered data lines by being applied with said operating voltage of a first voltage level, and when said switch circuit receives said first control signal of a second state, said switch circuit uncouples said odd-numbered data lines from said first group of odd-numbered sense amplifiers and said first group of odd-numbered sense amplifiers execute a second amplifying operation for said data of said selected memory cells coupled to said odd-numbered data lines by being applied with said operating voltage of a second voltage level, and
wherein, when said switch circuit receives said second control signal of said first state, said switch circuit couples said even-numbered data lines to said second group of even-numbered sense amplifiers and said second group of even- numbered sense amplifiers and said first amplifying operation for data of selected memory cells coupled to said even- numbered data lines by being applied with said operating voltage of said first voltage level, and when said switch circuit receives said second control signal of said second state, said switch circuit uncouples said even-numbered data lines from said second group of even-numbered sense amplifiers and said second group of even-numbered sense amplifiers said second amplifying operation for said data of said selected memory cells coupled to said even-numbered data lines by being applied with said operating voltage of said second voltage level, and
wherein an amplifying rate of said second amplifying operation is higher than an amplifying rate of said first amplifying operation.

28. A semiconductor memory device according to claim 27, further comprising a power supply circuit which generates said operating voltage of said first voltage level and said operating voltage of said second voltage level.

29. A semiconductor memory device according to claim 28, wherein said power supply circuit has a first power supply circuit generating said operating voltage of said first voltage level when a third control signal is applied thereto and a second power supply circuit generating said operating voltage of said second voltage level when a fourth control signal is applied thereto.

30. A semiconductor memory device according to claim 29, wherein said power supply circuit has an output outputting one of said operating voltage of said first voltage level and said operating voltage of said second voltage level, said first power supply circuit includes a first MOSFET transferring said operating voltage of said first voltage level to said output and said second power supply circuit includes a second MOSFET transferring said operating voltage of said second voltage level to said output, and wherein a gate width of said first MOSFET is smaller than a gate width of said second MOSFET.

31. A semiconductor memory device according to claim 30, wherein each of said plurality of sense amplifiers has a pair of input terminals, and said switch circuit couples said plurality of first data lines to ones of said pairs of input terminals of said plurality of sense amplifiers.

32. A semiconductor memory device according to claim 31, further comprising a plurality of second data lines, a plurality of memory cells each of which is coupled to a corresponding data line of a plurality of second data lines and a second switch circuit receiving said first and said second control signal.

33. A semiconductor memory device according to claim 32, further comprising a first precharge circuit coupled to said plurality of first data lines and a second precharge circuit coupled to said plurality of second data lines.

34. A semiconductor memory device according to claim 33, wherein said first precharge circuit precharges said plurality of first data lines to a precharge voltage having a predetermined potential and said second precharge circuit precharges said plurality of second data lines to a reference voltage having a potential lower than said precharge voltage.

35. A semiconductor memory device according to claim 34, wherein each of said plurality of sense amplifiers includes a flip-flop circuit.

36. A semiconductor memory device according to claim 35, wherein each of said memory cells is a nonvolatile memory cell.

37. A semiconductor memory device according to claim 36, wherein said nonvolatile memory cell includes a single MOSFET having a floating gate and a control gate.

38. A multi-value semiconductor memory device comprising:
a first data line;
a second data line;
a plurality of memory cells each of which has a threshold voltage in accordance with stored multi bit data therein and is coupled to one of said first and said second data lines;
a sense amplifier, having a pair of input terminals, and amplifying data of a selected memory cell by being applied with an operating voltage in a read operation; and
a first and a second switch circuit receiving a first control signal, wherein, in said read operation, when said first and said second switch circuits receive said first control signal of a first state, said first switch circuit couples said first data line to one of said pair of input terminals of said sense amplifier, said second switch circuit couples said second data line to the other of said pair of input terminals of said sense amplifier, and said sense amplifier is applied with said operating voltage of a first voltage level, and when said first and said second switch circuit receives said first control signal of a second state, said first switch circuit uncouples said first data line from one of said pair of input terminals of said sense amplifier, said second switch circuit uncouples said second data line from the other of said pair of input terminals of said sense amplifier, and said sense amplifier is applied with said operating voltage of a second voltage level higher than said first voltage level.

39. A multi-value semiconductor memory device according to claim 38, further comprising a power supply circuit which generates said operating voltage of said first voltage level and said operating voltage of said second voltage level.

40. A multi-value semiconductor memory device according to claim 39, wherein said power supply circuit has a first power supply circuit generating said operating voltage of said first voltage level when a second control signal is applied thereto and a second power supply circuit generating said operating voltage of said second voltage level when a third control signal is applied thereto.

41. A multi-value semiconductor memory device according to claim 40, wherein said power supply circuit has an output outputting one of said operating voltage of said first voltage level and said operating voltage of said second voltage level, said first power supply circuit includes a first MOSFET transferring said operating voltage of said first voltage level to said output and said second power supply circuit includes a second MOSFET transferring said operating voltage of said second voltage level to said output, a gate width of said first MOSFET being smaller than a gate width of said second MOSFET.

42. A multi-value semiconductor memory device according to claim 41, further comprising a first precharge circuit coupled to said first data line and a second precharge circuit coupled to said second data line.

43. A multi-value semiconductor memory device according to claim 42, wherein said first precharge circuit precharges said first data line to a precharge voltage having a predetermined potential and said second precharge circuit precharges said second data line to a reference voltage having a potential lower than said precharge voltage.

44. A multi-value semiconductor memory device according to claim 43, wherein said sense amplifier includes a flip-flop circuit.

45. A multi-value semiconductor memory device according to claim 44, wherein each of said memory cells is a nonvolatile memory cell.

46. A multi-value semiconductor memory device according to claim 45 wherein said nonvolatile memory cell includes a single MOSFET having a floating gate and a control gate.

47. A multi-value semiconductor memory device according to claim 46, further comprising a plurality of word lines coupled with corresponding memory cells of said plurality of memory cells, wherein a selected word line from said plurality of word lines is applied with a plurality of read voltages in said read operation.

48. A multi-value semiconductor memory device comprising:
a plurality of first data lines;
a plurality of memory cells each of which has a threshold voltage in accordance with stored multi-bit data therein and is coupled to a corresponding data line of said plurality of first data lines;
a plurality of sense amplifiers, having a first group of odd numbered sense amplifiers which correspond to odd-numbered data lines of said plurality of first data lines and a second group even-numbers sense amplifiers which correspond to even-numbered data lines of said plurality of first data lines, each of said sense amplifiers amplifying data of selected memory cells by being applied with an operating voltage in a read operation; and
a switch circuit receiving a first and a second control signal,
wherein when said switch circuit receives said first control signal of a first state, said switch circuit couples said odd-numbered data lines to said first group of odd-numbered sense amplifiers and said first group of odd-numbered sense amplifiers are applied with said operating voltage of a first voltage level, and when said switch circuit receives said first control signal of a second state, said switch circuit uncouples said odd-numbered data lines from said first group of odd-numbers sense amplifiers and said first group of odd-numbered sense amplifiers are applied with said operating voltage of a second voltage level higher than said first voltage level, and
wherein when said switch circuit receives said second control signal of said first state, said switch circuit couples said even-numbered data lines to said second group of even-numbered sense amplifiers and said second group of even-numbered sense amplifiers are applied with said operating voltage of said first voltage level, and when said switch circuit receives said second control signal of said second state, said switch circuit uncouples said even-numbered data lines from said second group of even-numbered sense amplifiers and said second group of even-numbered sense amplifiers are applied with said operating voltage of said second voltage level higher than said first voltage level.

49. A multi-value semiconductor memory device according to claim 48, further comprising a power supply circuit which generates said operating voltage of said first voltage level and said operating voltage of said second voltage level.

50. A multi-value semiconductor memory device according to claim 49, wherein said power supply circuit has a first power supply circuit generating said operating voltage of said first voltage level when a third control signal is applied thereto and a second power supply circuit generating said operating voltage of said second voltage level when a fourth control signal is applied thereto.

51. A multi-value semiconductor memory device according to claim 50, wherein said power supply circuit has an output outputting one of said operating voltage of said first voltage level and said operating voltage of said second voltage level, said first power supply circuit includes a first MOSFET transferring said operating voltage of said first voltage level to said output and said second power supply circuit includes a second MOSFET transferring said operating voltage of said second voltage level to said output, a gate width of said first MOSFET being smaller than a gate width of said second MOSFET.

52. A multi value semiconductor memory device according to claim 51, wherein each of said plurality of sense amplifiers has a pair of input terminals, and said switch circuit couples said plurality of first data lines to ones of said pairs of input terminals of said plurality of sense amplifiers.

53. A multi-value semiconductor memory device according to claim 52, further comprising a plurality of second data lines, a plurality of memory cells each of which is coupled to a corresponding data line of a plurality of second data lines and a second switch circuit receiving said first and said second control signal.

54. A multi-value semiconductor memory device according to claim 53, further comprising a first precharge circuit coupled to said plurality of first data lines and a second precharge circuit coupled to said plurality of second data lines.

55. A multi-value semiconductor memory device according to claim 54, wherein said first precharge circuit precharges said plurality of first data lines to a precharge voltage having a predetermined potential and said second precharge circuit precharges said plurality of second data lines to a reference voltage having a potential lower than said precharge voltage.

56. A multi-value semiconductor memory device according to claim 55, wherein each of said plurality of sense amplifiers includes a flip-flop circuit.

57. A multi-value semiconductor memory device according to claim 56, wherein each of said memory cells is a nonvolatile memory cell.

58. A multi-value semiconductor memory device according to claim 57, wherein said nonvolatile memory cell includes a single MOSFET having a floating gate and a control gate.

59. A multi-value semiconductor memory device according to claim 58, further comprising a plurality of word lines coupled with corresponding memory cells of said plurality of memory cells, wherein a selected word line from said plurality of word lines is applied with a plurality of read voltages in said read operation.

60. A multi-value semiconductor memory device comprising:
   a first data line;
   a plurality of electrically erasable and programmable memory cells each of which is coupled to said first data line and which stores multi bit data;
   a sense amplifier executing an amplifying operation of data of a selected memory cell by being applied with an operating voltage in a read operation; and
   a first switch circuit receiving a first control signal,
      wherein, in said read operation, when said first switch circuit receives said first control signal of a first state, said first switch circuit couples said first data line to said sense amplifier, and said sense amplifier executes a first amplifying operation for data of a selected memory cell by being applied with said operating voltage of a first voltage level, and when said first switch circuit receives said first control signal of a second state, said first switch circuit uncouples said first data line from said sense amplifier and said sense amplifier executes a second amplifying operation for said data by being applied with said operating voltage of a second voltage level, wherein an amplifying rate of said second amplifying operation is higher than an amplifying rate of said first amplifying operation.

61. A multi-value semiconductor memory device according to claim 60, further comprising a power supply circuit which generates said operating voltage of said first voltage level and said operating voltage of said second voltage level.

62. A multi-value semiconductor memory device according to claim 61, wherein said power supply circuit has a first power supply circuit generating said operating voltage of said first voltage level when a second control signal is applied thereto and a second power supply circuit generating said operating voltage of said second voltage level when a third control signal is applied thereto.

63. A multi-value semiconductor memory device according to claim 62, wherein said power supply circuit has an output outputting one of said operating voltage of said first voltage level and said operating voltage of said second voltage level, said first power supply circuit includes a first MOSFET transferring said operating voltage of said first voltage level to said output and said second power supply circuit includes a second MOSFET transferring said operating voltage of said second voltage level to said output, a gate width of said first MOSFET being smaller than a gate width of said second MOSFET.

64. A multi-value semiconductor memory device according to claim 63, wherein said sense amplifier has a pair of input terminals, and said switch circuit couples said first data line to one of said pair of input terminals of said sense amplifier.

65. A multi-value semiconductor memory device according to claim 64, further comprising a second data line, a plurality of memory cells each of which is coupled to said second data line and a second switch circuit receiving said first control signal.

66. A multi-value semiconductor memory device according to claim 65, further comprising a first precharge circuit coupled to said first data line and a second precharge circuit coupled to said second data line.

67. A multi-value semiconductor memory device according to claim 66, wherein said first precharge circuit precharges said first data line to a precharge voltage having a predetermined potential and said second precharge circuit precharges said second data line to a reference voltage having a potential lower than said precharge voltage.

68. A multi-value semiconductor memory device according to claim 67, wherein said sense amplifier includes a flip-flop circuit.

69. A multi-value semiconductor memory device according to claim 68, wherein each of said memory cells is a nonvolatile memory cell.

70. A multi-value semiconductor memory device according to claim 69, wherein said nonvolatile memory cell includes a single MOSFET having a floating gate and a control gate.

71. A multi-value semiconductor memory device according to claim 70, further comprising a plurality of word lines coupled with corresponding memory cells of said plurality of memory cells, wherein a selected word line from said plurality of word lines is applied with a plurality of read voltages in said read operation.

72. A multi-value semiconductor memory device comprising:
   a plurality of first data lines;
   a plurality of electrically erasable and programmable memory cells each of which is coupled to a corresponding data line of said plurality of first data lines and which stores multi bit data;
   a plurality of sense amplifiers, having a first group of odd numbered sense amplifiers which correspond to odd-numbered data lines of said plurality of first data lines and a second group even-numbered sense amplifiers which correspond to even-numbered data lines of said plurality of first data lines, and each executing an amplifying operation of data of selected memory cells by being applied with an operating voltage in a read operation; and a switch circuit receiving a first and a second control signal, wherein when said switch circuit receives said first control signal of a first state, said switch circuit couples said odd-numbered data lines to said first group of odd-numbered sense amplifiers and said first group of odd-numbered sense amplifiers execute a first amplifying operation for data of selected memory cells coupled to said odd-numbered data lines by being applied with said operating voltage of a first voltage level, and when said switch circuit receives said first control signal of a second state, said switch circuit uncouples said odd-numbered data lines from said first group of odd-numbered sense amplifiers and said first group of odd-numbers sense amplifiers execute a second amplifying operation for said data of said selected memory cells coupled to said odd-numbered data lines by being applied with said operating voltage of a second voltage level, and wherein when said switch circuit receives said second control signal of said first state, said switch circuit couples said even-numbered data lines to said second group of even-numbered sense amplifiers and said second group of even-numbered sense amplifiers execute said first amplifying operation for data of selected memory cells coupled to said even-numbered data lines by being applied with said operating voltage of said first voltage level, and when said switch circuit receives said second control signal of said second state, said switch circuit uncouples said even-numbered data lines from said second group of even-numbered sense amplifiers and said second group of even-numbered sense amplifiers execute said second amplifying operation for said data of said selected memory cells coupled to said even-numbered data lines by being applied with said operating voltage of said second voltage level, wherein an amplifying rate of said second amplifying operation is higher than an amplifying rate of said first amplifying operation.

73. A multi-value semiconductor memory device according to claim 72, further comprising a power supply circuit which generates said operating voltage of said first voltage level and said operating voltage of said second voltage level.

74. A multi-value semiconductor memory device according to claim 73, wherein said power supply circuit has a first power supply circuit generating said operating voltage of said first voltage level when a third control signal is applied thereto and a second power supply circuit generating said operating voltage of said second voltage level when a fourth control signal is applied thereto.

75. A multi-value semiconductor memory device according to claim 76, wherein said power supply circuit has an output outputting one of said operating voltage of said first voltage level and said operating voltage of said second voltage level, said first power supply circuit includes a first MOSFET transferring said operating voltage of said first voltage level to said output and said second power supply circuit includes a second MOSFET transferring said operating voltage of said second voltage level to said output, a gate width of said first MOSFET being smaller than a gate width of said second MOSFET.

76. A multi-value semiconductor memory device according to claim 75, wherein each of said plurality of sense amplifiers has a pair of input terminals, and said switch circuit couples said plurality of first data lines to ones of said pairs of input terminals of said plurality of sense amplifiers.

77. A multi-value semiconductor memory device according to claim 76, further comprising a plurality of second data lines, a plurality of memory cells each of which is coupled to a corresponding data line of a plurality of second data lines and a second switch circuit receiving said first and said second control signal.

78. A multi-value semiconductor memory device according to claim 77, further comprising a first precharge circuit coupled to said plurality of first data lines and a second precharge circuit coupled to said plurality of second data lines.

79. A multi-value semiconductor memory device according to claim 78, wherein said first precharge circuit precharges said plurality of first data lines to a precharge voltage having a predetermined potential and said second precharge circuit precharges said plurality of second data lines to a reference voltage having a potential lower than said precharge voltage.

80. A multi-value semiconductor memory device according to claim 79, wherein each of said plurality of sense amplifiers includes a flip-flop circuit.

81. A multi-value semiconductor memory device according to claim 80, wherein each of said memory cells is a nonvolatile memory cell.

82. A multi-value semiconductor memory device according to claim 81, wherein said nonvolatile memory cell includes a single MOSFET having a floating gate and a control gate.

83. A multi-value semiconductor memory device according to claim 82, further comprising a plurality of word lines coupled with corresponding memory cells of said plurality of memory cells, wherein a selected word line from said plurality of word lines is applied with a plurality of read voltages in said read operation.

* * * * *